(12) United States Patent
Sato

(10) Patent No.: US 7,787,226 B2
(45) Date of Patent: Aug. 31, 2010

(54) ELECTROSTATIC PROTECTIVE CIRCUIT AND SEMICONDUCTOR DEVICE

(75) Inventor: Masaharu Sato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 91 days.

(21) Appl. No.: 11/781,009

(22) Filed: Jul. 20, 2007

(65) Prior Publication Data

US 2008/0024946 A1 Jan. 31, 2008

(30) Foreign Application Priority Data

Jul. 27, 2006 (JP) ............... 2006-204715

(51) Int. Cl.
*H02H 9/04* (2006.01)

(52) U.S. Cl. .................................. 361/56

(58) Field of Classification Search ............ 361/56; 362/212

See application file for complete search history.

(56) References Cited

U.S. PATENT DOCUMENTS

| 4,819,047 | A | * | 4/1989 | Gilfeather et al. ............ 257/357 |
| 5,637,900 | A | * | 6/1997 | Ker et al. .................... 257/355 |
| 5,835,328 | A | * | 11/1998 | Maloney et al. ............. 361/111 |
| 6,909,357 | B1 | * | 6/2005 | Bandy et al. ................ 340/5.65 |
| 2008/0094767 | A1 | * | 4/2008 | Watanabe .................... 361/56 |

FOREIGN PATENT DOCUMENTS

JP 2002-50640 A 2/2002
JP 2006-100532 A 4/2006

* cited by examiner

*Primary Examiner*—Jared J Fureman
*Assistant Examiner*—Angela Brooks
(74) *Attorney, Agent, or Firm*—Sughrue Mion, PLLC

(57) ABSTRACT

An electrostatic protective circuit includes a bipolar transistor, a bipolar transistor and an FET. The bipolar transistors and are coupled in series between a signal line and the ground (GND). The FET is configured that a source and a bulk thereof are coupled to a node N situated between the bipolar transistors, a gate is coupled to the signal line, and a drain is coupled to the power supply.

17 Claims, 22 Drawing Sheets

ELECTROSTATIC PROTECTIVE CIRCUIT AND SEMICONDUCTOR DEVICE

This application is based on Japanese patent application No. 2006-204715, the content of which is incorporated hereinto by reference.

BACKGROUND

1. Technical Field

The present invention relates to an electrostatic protective circuit and a semiconductor device.

2. Related Art

FIG. 16 is a circuit schematic, illustrating a conventional electrostatic protective circuit. An electrostatic protective circuit 100 comprises bipolar transistors Q1 and Q2, serving as protective elements. In the bipolar transistor Q1 and Q2, collectors are mutually coupled. Further, an emitter and a base of the bipolar transistor Q1 are coupled to a signal line 102, and an emitter and a base of the bipolar transistor Q2 are coupled to a power supply (indicated as "GND" in FIG. 16). One end of the signal line 102 is coupled to an external terminal 104, and another end is coupled to an internal circuit (not shown).

When a positive signal potential is provided to the signal line 102 in such electrostatic protective circuit 100, a forward bias voltage is applied to a diode (first diode), which is composed of a collector-base junction of the bipolar transistor Q1, and a reverse bias voltage is applied to a diode (second diode), which is composed of a collector-base junction of the bipolar transistor Q2. Therefore, a positive potential of up to a breakdown voltage for the second diode can be applied to the signal line 102. On the other hand, when a negative signal potential is applied to the signal line 102, the first diode is inversely biased, and the second diode is forward biased. Therefore, a negative potential of up to a breakdown voltage for the first diode can be applied to the signal line 102.

In addition to above, prior art documents related to the present invention include: Japanese Patent Laid-Open No. 2002-50,640 and Japanese Patent Laid-Open No. 2006-100, 532.

However, the present inventor has recognized that a dielectric breakdown of the protective element may be caused, even if the level of the signal potential is less than a breakdown voltage for a protective element (i.e., bipolar transistor Q1, Q2), when a signal potential input to the external terminal 104 is precipitously changed in the electrostatic protective circuit 100 of FIG. 16.

The details concerning such phenomenon will be described in reference to FIG. 17A and FIG. 17B. Abscissa of these graphs represent time t, and potential $\phi$ is shown in ordinate. In addition, a dotted line L1 and a dotted line L2 in the graphs illustrate the above-described breakdown voltages of the first and the second diodes, respectively. In FIG. 17A, waveforms of a signal potential and a potential at a node N are presented by a solid line and a dotted line, respectively. In FIG. 17B, a waveform of a voltage applied to the bipolar transistor Q1 (=signal potential−potential at node N) is presented.

First of all, the first diode is forward biased as the signal potential is increased (I), such that a potential at the node N (see FIG. 16) is also increased as following the increased signal potential. However, in this case, the potential at the node N in lower than the signal potential by only a certain level (around 0.5 V).

Next, when the signal potential is to be dropped (II), the potential at the node N is also to be dropped. However, as shown in FIG. 16, a parasitic capacitance C1 is created between the node N and the ground (indicated as "GND" in FIG. 16). Thus, when the signal potential is rapidly changed, the potential at the node N can not follow the change of the signal potential, due to the parasitic capacitance C1. Then, this results in the first diode being applied with a larger inverse bias voltage, and eventually the inverse bias voltage is increased to reach the breakdown voltage (BVcbo) for the first diode (III). As described above, even if the level of the signal potential is lower than the breakdown voltage for the diode, the level of the reverse bias applied to the diode can reach the above-described breakdown voltage, and this can lead to a dielectric breakdown.

SUMMARY

In one embodiment, there is provided an electrostatic protective circuit, comprising: a first and a second protective elements, which are coupled in series between a signal line and a power supply; and a field effect transistor (FET), having a source, a bulk, a gate and a drain, wherein the source and the bulk are coupled between the first and the second protective elements, the gate is coupled to the signal line, and the drain is coupled to the power supply.

In such electrostatic protective circuit, an FET is coupled to the node situated between the first and the second protective elements. Consequently, even if the signal potential is rapidly changed the potential at the node can follow the change of the signal potential. This allows preventing a problem of causing a dielectric breakdown of the protective element, even if the level of the signal potential is less than a breakdown voltage for a protective element.

According to the present invention, an electrostatic protective circuit having a constitution, which is suitable for preventing a protective element from causing a dielectric breakdown and a semiconductor device comprising such constitution, can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of electrostatic protective circuits and semiconductor devices according to the present invention will be described in reference to the annexed figures.

In all figures, identical numeral is assigned to an element commonly appeared in the description of the present invention in reference to the figures, and the detailed description thereof will not be repeated.

First Embodiment

Figure 1:
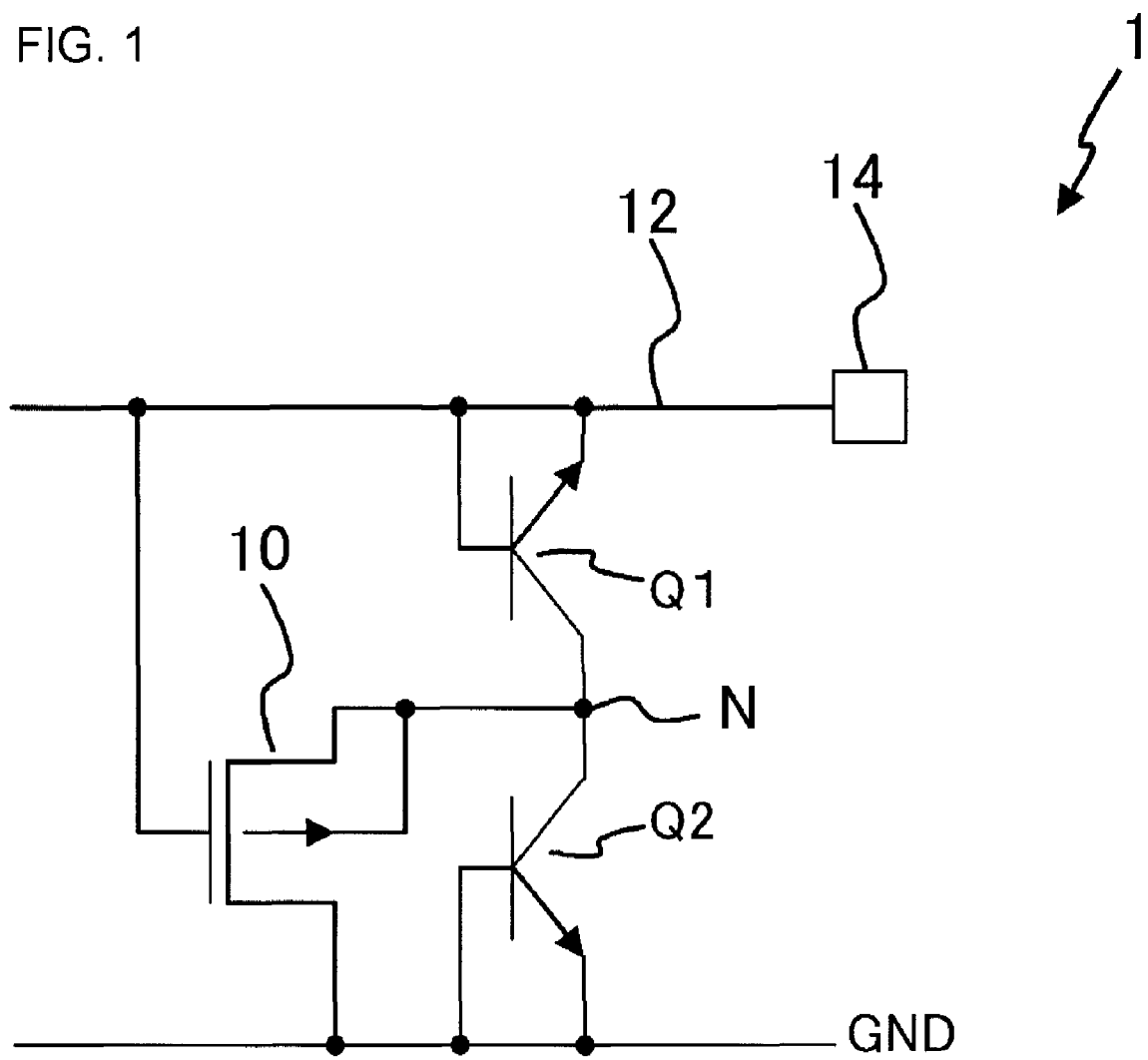
FIG. 1 is a circuit schematic, illustrating first embodiment of an electrostatic protective circuit according to the present invention.

FIG. 1 is a circuit schematic, illustrating first embodiment of an electrostatic protective circuit according to the present invention. An electrostatic protective circuit 1 includes a bipolar transistor Q1, a bipolar transistor Q2 and a field effect transistor (FET) 10. The bipolar transistors Q1 and Q2 is coupled mutually in series between a signal line 12 and a power supply (ground [indicated as "GND" in FIG. 1] in the present embodiment). In the present embodiment, the Bipolar transistors Q1 and Q2 are npn-type, and the FET 10 is a p-channel type.

In the bipolar transistor Q1 and Q2, collectors of the transistors are mutually coupled. Further, an emitter and a base of the bipolar transistor Q1 are coupled to a signal line 12, and an emitter and a base of the bipolar transistor Q2 are coupled to the power supply.

The FET 10 is a metal-insulator-semiconductor (MIS) FET, and a source and a bulk thereof are coupled to a node N situated between the bipolar transistors Q1 and Q2, a gate is coupled to the signal line 12, and a drain is coupled to the power supply.

One end of the signal line 12 is coupled to an external terminal 14. Another end of the signal line 12 is coupled to, for example, an internal circuit (not shown) of the semiconductor device having the electrostatic protective circuit 1.

When a positive signal potential is applied to the signal line 12 in such electrostatic protective circuit 1, a diode (first diode) composed of a collector-base junction of the bipolar transistor Q1 is forward biased, and a diode (second diode) composed of a collector-base junction of the bipolar transistor Q2 is inversely biased. Therefore, a positive potential of up to a breakdown voltage for the second diode can be applied to the signal line 12. On the other hand, when a negative signal potential is applied to the signal line 12, the first diode is inversely biased, and the second diode is forward biased. Therefore, a negative potential of up to a breakdown voltage for the first diode can be applied to the signal line 12.

Figure 2:
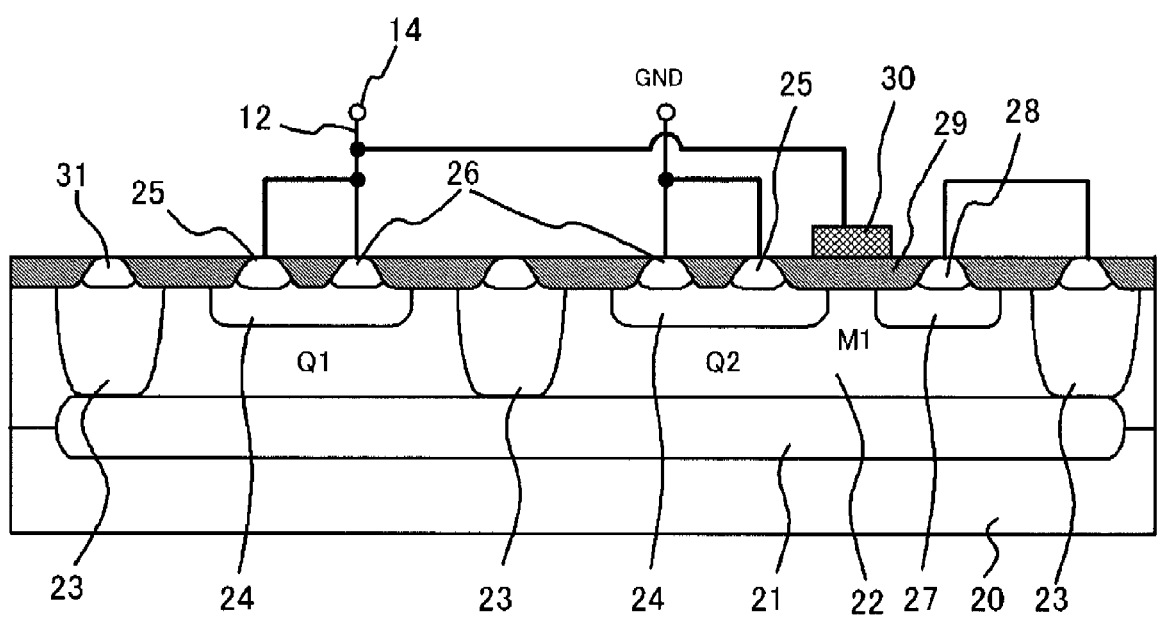
FIG. 2 is a cross-sectional view, illustrating an example of a structure of the electrostatic protective circuit of FIG. 1.

FIG. 2 is a cross-sectional view, illustrating an example of a structure of the electrostatic protective circuit 1. An n-type buried layer 21, which corresponds to the node N, is formed within a p-type substrate 20, and an n-type region 22, which serves as collectors of the bipolar transistors Q1 and Q2, is formed on the n-type buried layer 21. In addition, an n-type drawing region 23 is formed so as to surround regions for elements from the surface of the p-type substrate 20 to reach the n-type buried layer 21. In addition, such n-type drawing regions 23 are also formed between each elements. An n-type diffusion layer 31 is formed within the n-type drawing region 23.

A p-type region 24 serving as a base is formed in a region for forming a bipolar transistor within the region defined by the n-type drawing region 23, and a p-type diffusion layer 25 serving as a drawing region for a base and an n-type diffusion layer 26 serving as an emitter are formed therein. A p-type region 27 serving as a source is formed in a common area of the bipolar transistor Q2 and the FET 10 (M1 in FIG. 2) spaced apart from the p-type region 24. An oxide film 29 for isolation is formed between the p-type region 24 and the p-type region 27, and a gate electrode 30 is formed thereon. Then, in this embodiment, the p-type region 27 is coupled to the node N (n-type buried layer 21) through the p-type diffusion layer 28 and the n-type drawing region 23. This achieves the circuit of FIG. 1.

In this embodiment, the impurity-diffusing layer (p-type region 24) functioning as the drain of the FET 10 is provided within the semiconductor substrate (p-type substrate 20), and such impurity-diffusing layer constitutes a portion of the bipolar transistor Q2. This configuration allows reducing the area of the electrostatic protective circuit 1, and eventually reducing the chip area of the semiconductor device that includes the electrostatic protective circuit 1. In addition, since the oxide film 29 for element isolation is employed as the gate insulating film, sufficiently higher breakdown voltage can be obtained.

Figure 3:
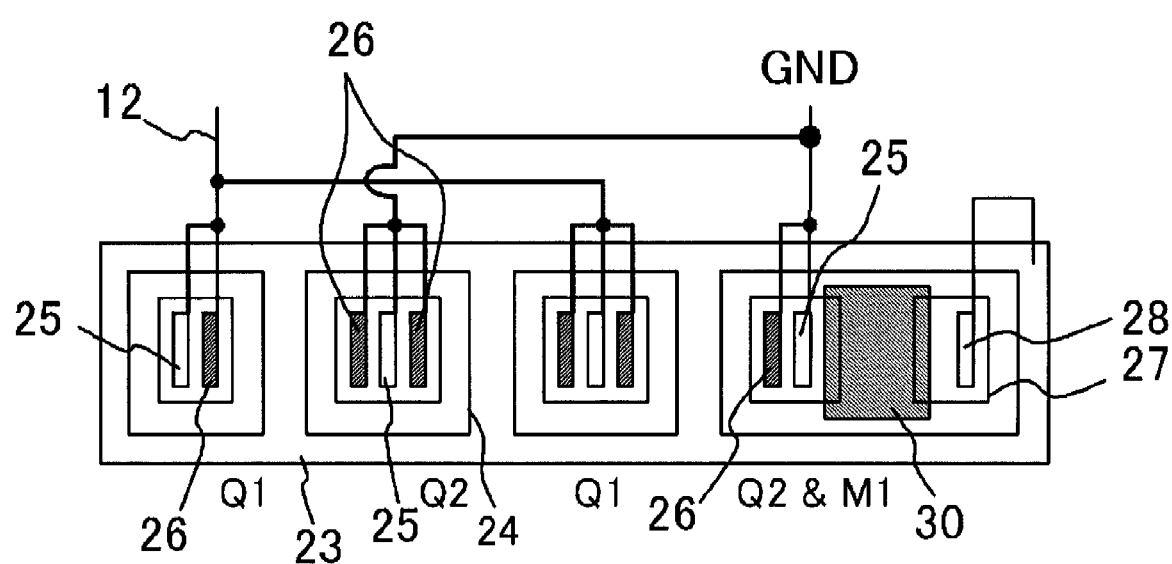
FIG. 3 is a plan view, illustrating an example of a structure of the electrostatic protective circuit of FIG. 1.

In addition to above, the exemplary implementation having each one of bipolar transistors Q1 and Q2 is illustrated in reference to FIG. 2, a plurality of bipolar transistors Q1 and a plurality of bipolar transistors Q2 may be provided, as shown in FIG. 3. Even in such case, only one FET may be sufficient to be formed. In addition, in a type of a bipolar transistor that is sandwiched between both sides, it is preferable to dispose the n-type diffusion layers 26 on both sides of the p-type diffusion layer 25.

Figure 17A:
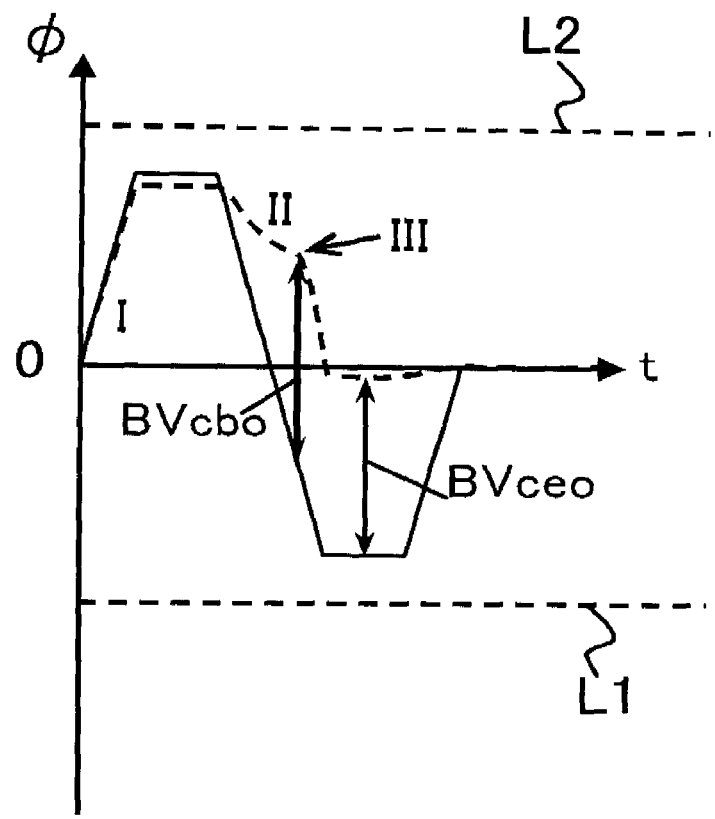
FIGS. 17A and 17B are graphs, useful in describing an exemplary operation of an electrostatic protective circuit of FIG. 16.

Advantageous effects obtainable by employing the configuration according to the present embodiment will be described. An operation of the electrostatic protective circuit 1 will be considered in the case of being applied with a signal potential, which is swung considerably toward the positive direction at the beginning and then swung considerably toward the negative direction (see FIG. 17A). First of all, when the signal potential is increased, the first diode is also forward biased, so that the potential at the node N follows the signal potential to be increased. Then, the signal potential is decreased as compared with the potential at the node N, as the level of the signal potential is dropped. This provides the gate potential of the FET 10 coupled to the node N, which is lower than the source and the bulk potentials, such that the state of the FET 10 is transferred to the conducting state. Consequently, the potential at the node N is decreased as following the change in the signal potential, and eventually falls in the ground potential. This allows the first diode from being applied with an unusual level of voltage.

Since the FET 10 is coupled to the node N between the protective elements (bipolar transistors Q1 and Q2) in the electrostatic protective circuit 1 as described above, the potential at the node N can follow the change in the signal potential, even if the signal potential changes rapidly. This allows preventing a problem of causing a dielectric breakdown of the protective element, even if the level of the signal potential is less than a breakdown voltage for a protective element.

Figure 16:
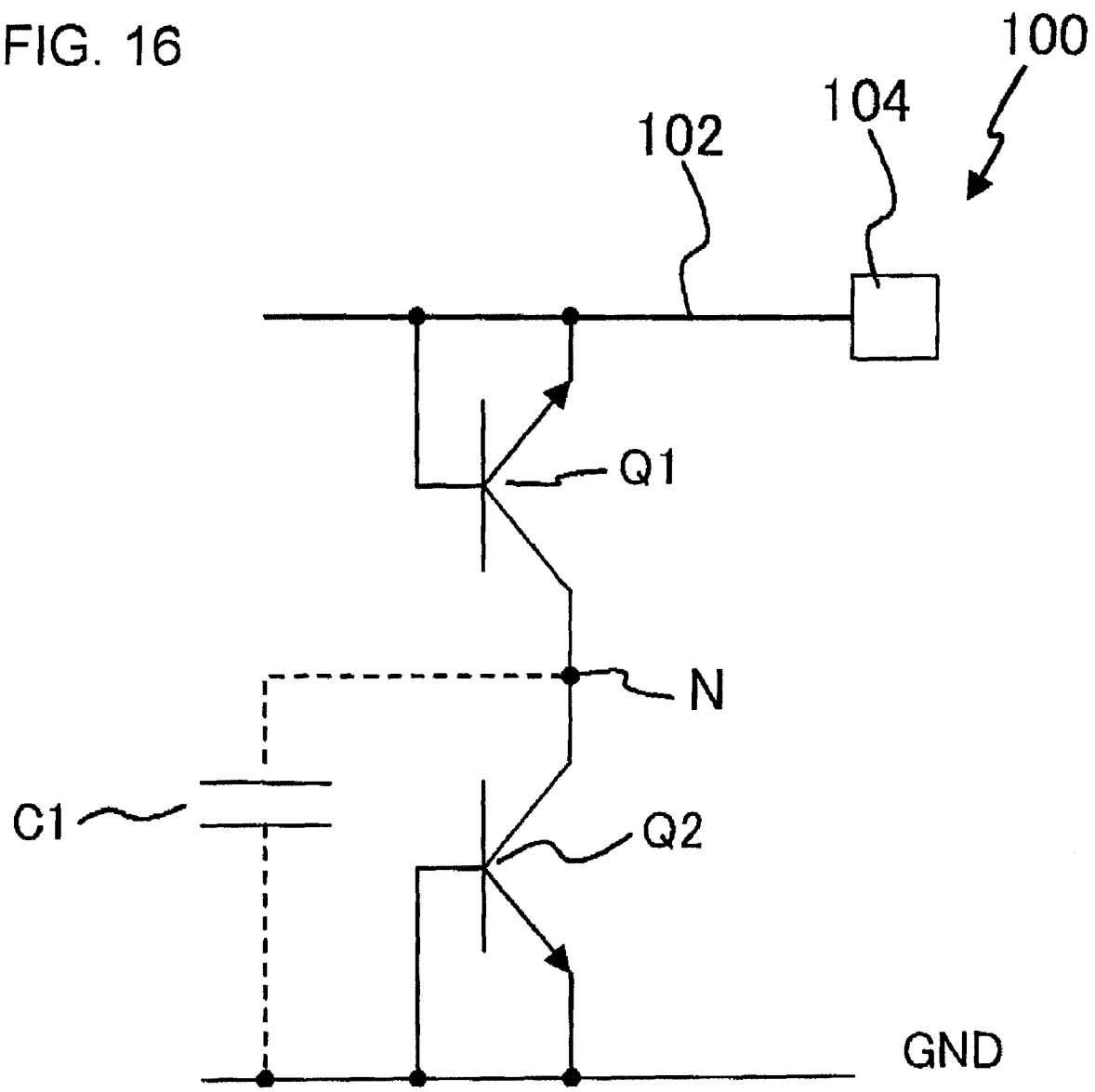
FIG. 16 is a circuit schematic, illustrating a conventional electrostatic protective circuit.
Figure 17B:
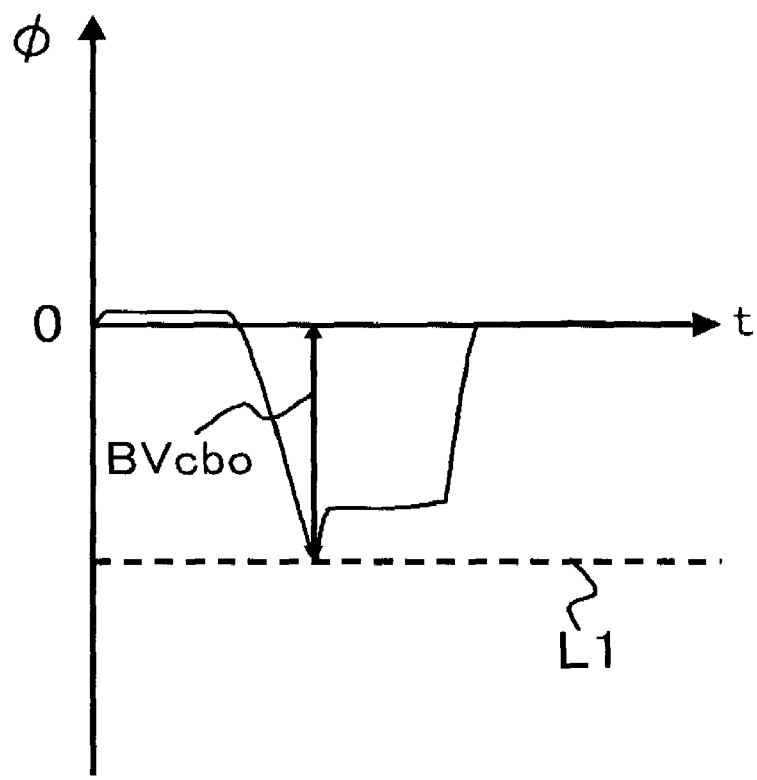

On the contrary, in the electrostatic protective circuit 100 shown in FIG. 16, as have been described above in reference to FIG. 17A and FIG. 17B, the potential at the node N can not follow the change in the signal potential, due to a creation of a parasitic capacitance C1, and the dielectric breakdown of the protective element is caused even if the level of the signal potential is lower than the breakdown voltage for the protective element. Then, the bipolar transistor Q1 is in the conducting state, allowing the bipolar operation. When the bipolar transistor Q1 commences the bipolar operation as described above, a breakdown voltage between the collector and the emitter (BVceo) appears as the breakdown voltage of the bipolar transistor Q1. Since the relationship of these breakdown voltages is: BVceo<BVcbo, the voltage applied to the transistor Q1 is decreased simultaneously with the creation of the dielectric breakdown (snapback phenomenon).

Figure 18A:
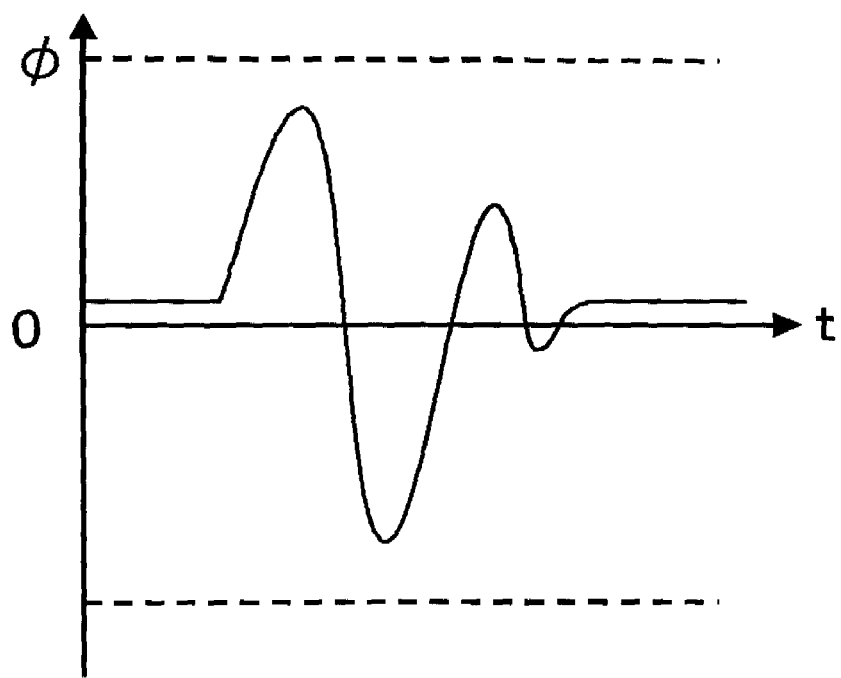
FIGS. 18A and 18B are graphs, useful in describing an exemplary operation of an electrostatic protective circuit of FIG. 16.
Figure 18B:
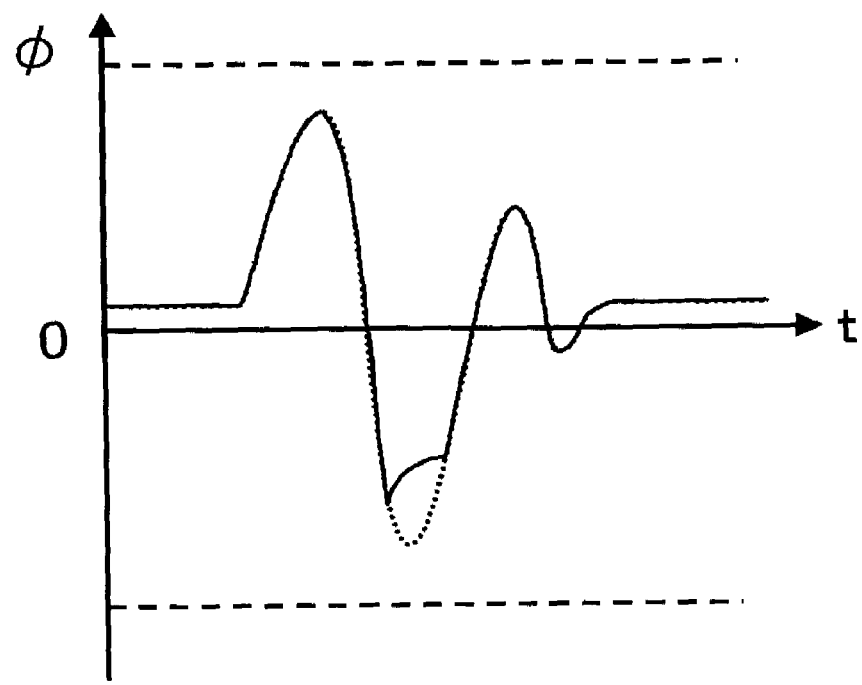

As a result, a problem of greatly deformed real waveform of the potential at the external terminal 104 as shown in FIG. 18B may be caused, when a signal having a waveform as shown in FIG. 18A is entered to the external terminal 104 of the electrostatic protective circuit 100. According to the present embodiment, such problem can be avoided.

Figure 22:
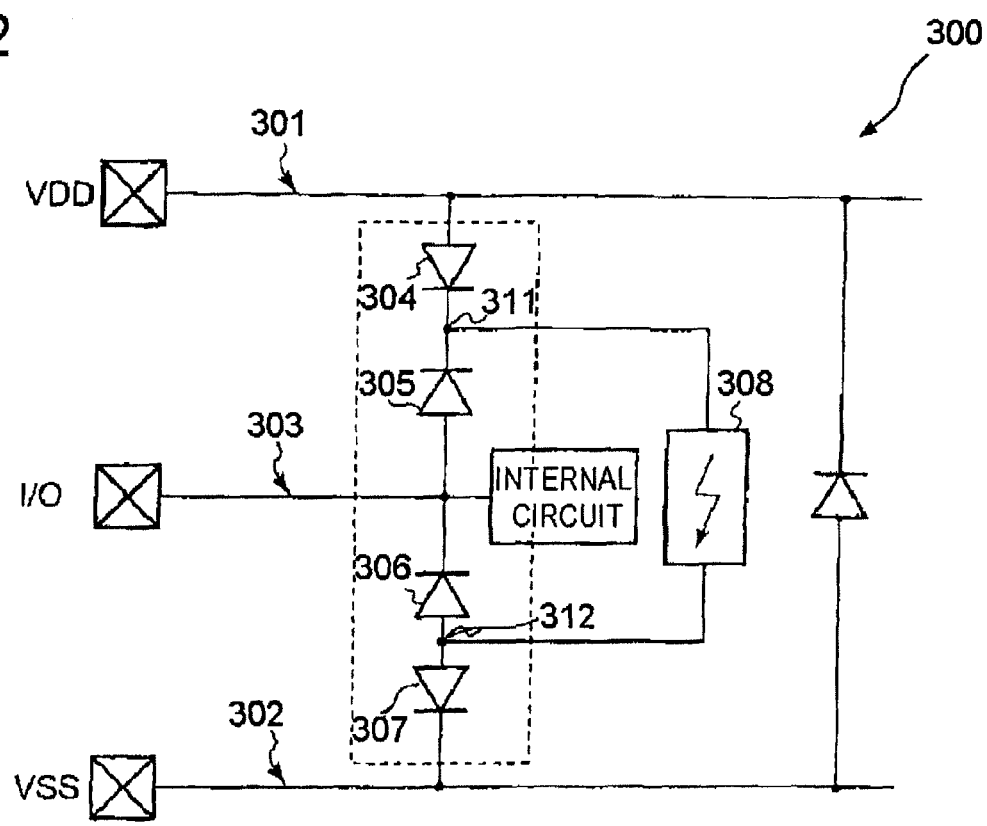
FIG. 22 is a circuit schematic, illustrating a conventional electrostatic protective circuit.

Meanwhile, Japanese Patent Laid-Open No. 2006-100,532 discloses an electrostatic protective circuit having a thyristor coupled to a node between protective elements. FIG. 22 is circuit schematic illustrating an electrostatic protective circuit of the literature. In an electrostatic protective circuit 300, diodes 304 and 305 serving as protective elements are provided, between a power supply 301 (indicated as "VDD" in FIG. 22) and a signal line 303, and diodes 306 and 307 serving as protective elements are provided between a power supply 302 (indicated as "VSS" in FIG. 22) and a signal line 303. In addition, a thyristor 308 is coupled across a node 311 between the diodes 304 and 305 and a node 312 between the diodes 306 and 307.

An object of providing such electrostatic protective circuit 300 is to provide an improved protection efficiency while reducing the parasitic capacitance at the input-output terminal. More specifically, it is required to increase the resistance in the reverse operation in order to increase the electrostatic protection capacity of the diode, and this requirement causes a necessity to have an increased dimension thereof, which leads to creating larger parasitic capacitance, leading to an obstacle in the rapid operation. In addition, since it is difficult to provide a reduced breakdown voltage of the diode, circuits utilizing the inverse breakdown voltage are not suitable for lower voltage circuits.

In order to solve such problem, the electrostatic protective circuit 300 employs a thyristor, and a manner for optimizing the operating voltage of such thyristor is taken. Having this configuration, the document recites that the operations of the diodes are limited to only the forward operations at all times during the operation of the protection circuit, so that higher endurances can be obtained with a reduced device dimension.

It is also described that, as a result, a reduced capacitance of the input terminal can be achieved. In addition, it is also described that the operating voltage of the protection circuit is sum of the operating voltage of the thyristor and the forward voltage of the diode, providing a configuration that requires only a lower voltage for the operation.

On the contrary, the electrostatic protective circuit according to the present embodiment is configured that the circuit (i.e., FET 10) for escaping a charge from the node N is added in order to prevent the potential at the node N from being fixed at higher level, and therefore both the constitution and the characteristics of the operation are different from the electrostatic protective circuit 300 disclosed in the prior art document.

Firstly, the electrostatic protective circuit 300 disclosed in the prior art document cannot be employed for drawing a charge from the node between the protective elements. For example, in order to draw a charge accumulated at the nodes 311 and 312 in the conventional electrostatic protective circuit 300, the thyristor 308 is required to be in operation. However, when thyristor 308 is in operation, an electric current is applied to the signal line 303 from the power supply 301 through the diodes 304 and 306, which causes a problem on the circuit operation.

In addition to above, while the exemplary implementation that provides the protective elements between the signal line and the ground (GND) is illustrated in the present embodiment, the protective elements may alternatively be provided between the signal line and the positive power supply voltage (Vdd). More specifically, "GND" may be replaced with "Vdd" in FIG. 1.

Figure 4:
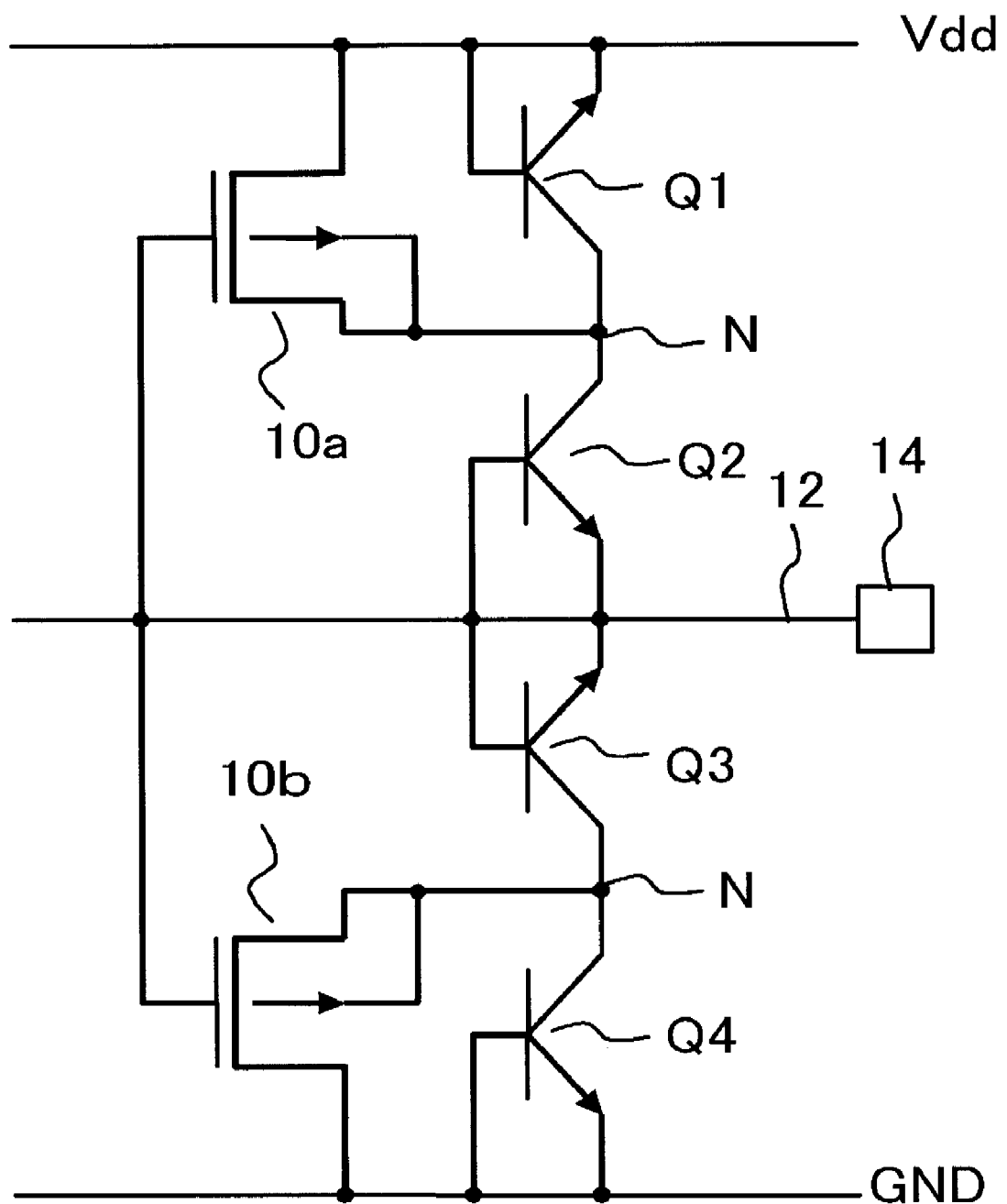
FIG. 4 is a circuit schematic, illustrating a modified version of the electrostatic protective circuit of FIG. 1.

In addition, as shown in FIG. 4, protective elements may be provided between the signal line and the ground (GND) and between the signal line and the power supply voltage (Vdd). In the circuit schematic of FIG. 4, the bipolar transistors Q1 and Q2 are provided as the protective elements between the signal line 12 and power supply voltage (Vdd), and the bipolar transistors Q3 and Q4 are provided as the protective elements between the signal line 12 and the ground (GND). A source and a bulk of the FET 10a are coupled to the node N between the bipolar transistors Q1 and Q2. A gate and a drain of the FET 10a are coupled to the signal line 12 and the power supply voltage (Vdd), respectively. A source and a bulk of the FET 10b are coupled to the node N between the bipolar transistors Q3 and Q4. A gate and a drain of the FET 10b are coupled to the signal line 12 and the ground (GND), respectively.

Figure 5:
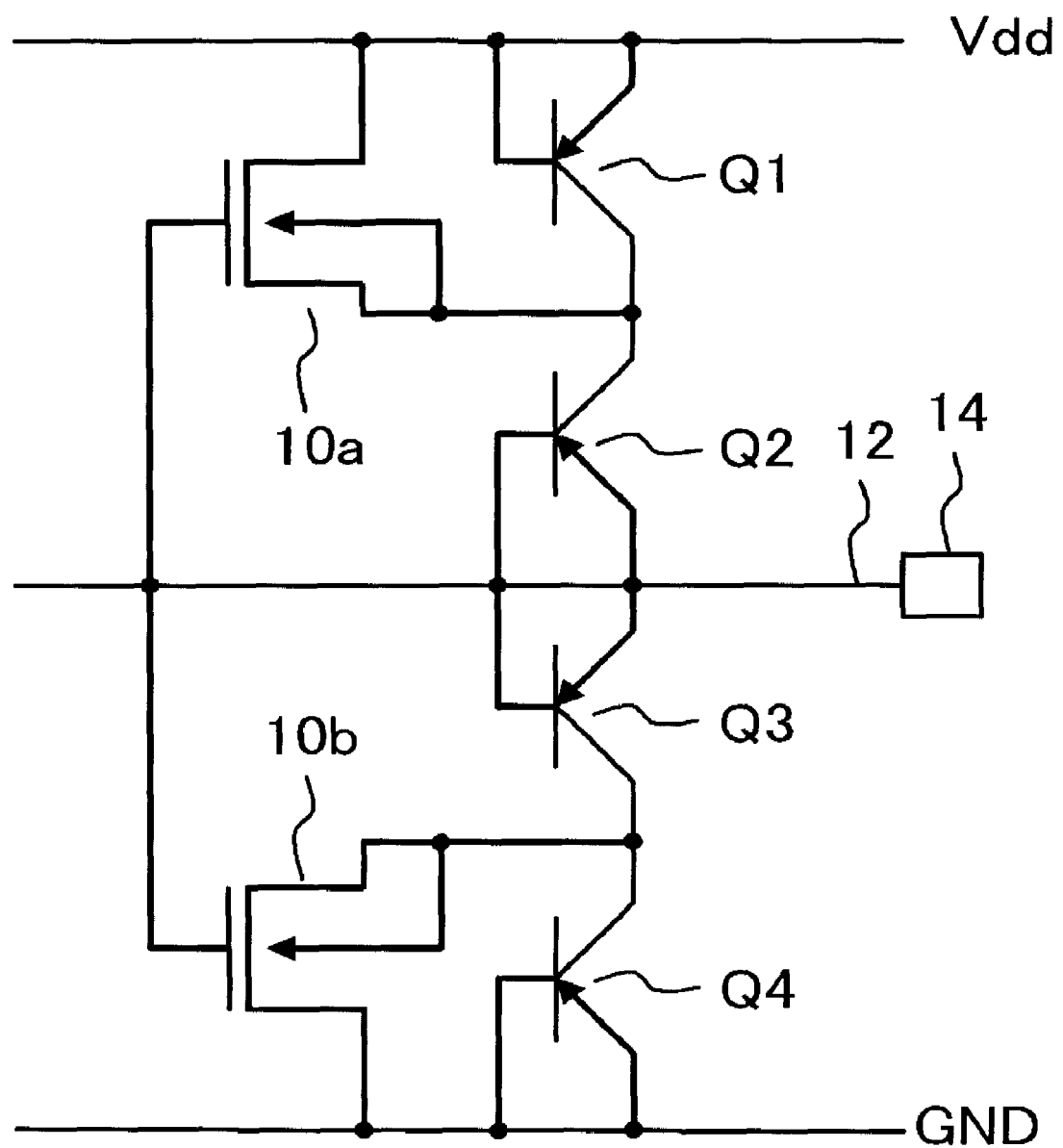
FIG. 5 is a circuit schematic, illustrating another modified version of the electrostatic protective circuit of FIG. 1.

While the npn-type bipolar transistors and the p-channel type FETs have been illustrated in the present embodiment, pnp type bipolar transistors and n-channel type FETs may alternatively be employed. An exemplary implementation thereof is shown in FIG. 5, where a circuit has similar configuration as shown in FIG. 4, except that the bipolar transistors Q1 to Q4 are pnp-type transistors, and the FETs 10a and 10b are the n-channel FETs.

Second Embodiment

Figure 6:
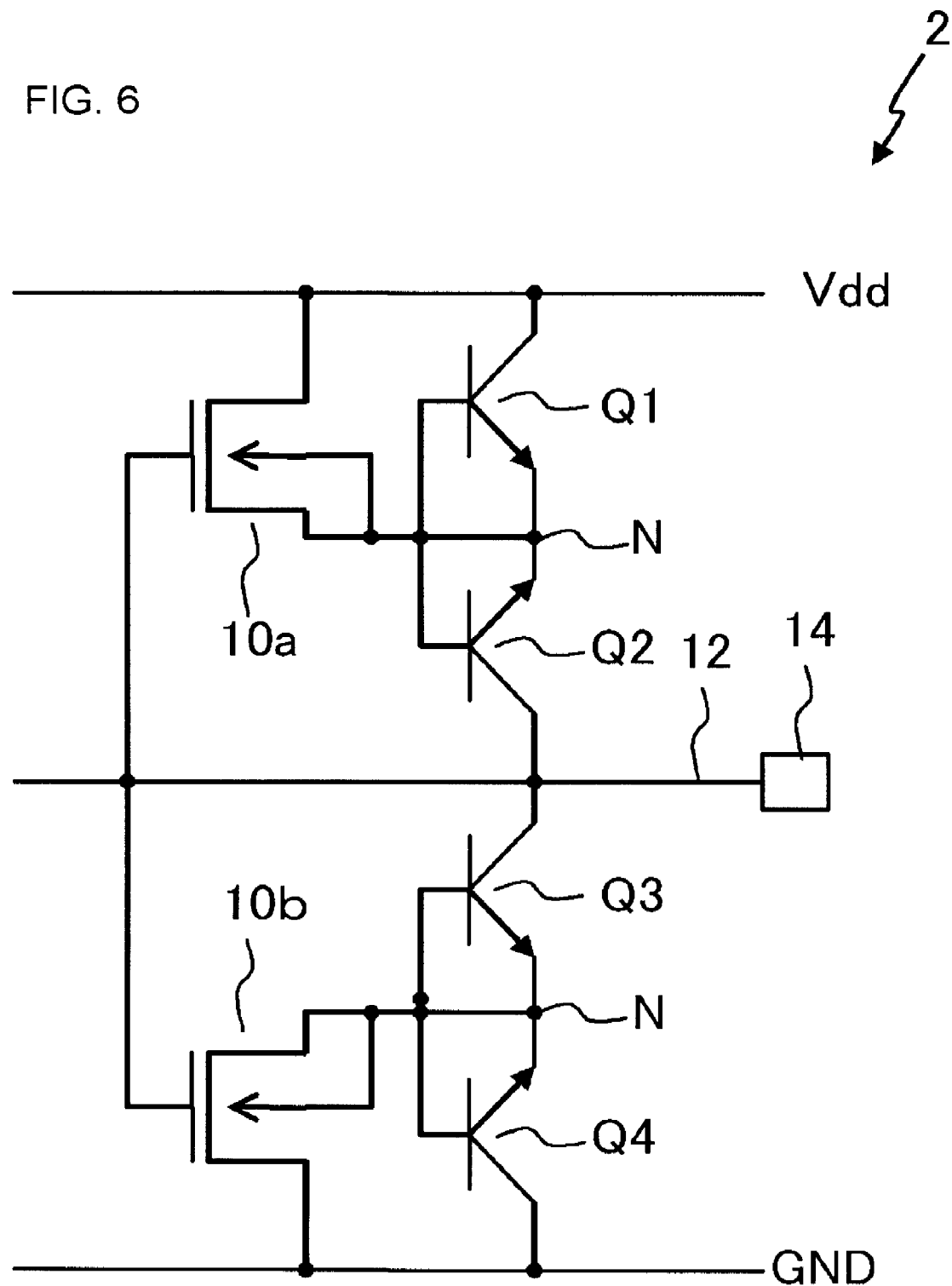
FIG. 6 is circuit schematic, illustrating second embodiment of an electrostatic protective circuit according to the present invention.

FIG. 6 is a circuit schematic, illustrating second embodiment of an electrostatic protective circuit according to the present invention. In an electrostatic protective circuit 2, bipolar transistors Q1 and Q2 are provided as protective elements between a signal line 12 and a power supply voltage (Vdd), and bipolar transistors Q3 and Q4 are provided as protective elements between the signal line and the ground (GND). An emitter and a base of the bipolar transistor Q1 are coupled to an emitter and a base of the bipolar transistor Q2, respectively. In addition, a collector of the bipolar transistor Q1 is coupled to Vdd, and a collector of the bipolar transistor Q2 is coupled to the signal line 12. Similarly, an emitter and a base of the bipolar transistor Q3 are coupled to an emitter and a base of the bipolar transistor Q4, respectively. In addition, a collector of the bipolar transistor Q3 is coupled to the signal line 12, and a collector of the bipolar transistor Q2 is coupled to GND.

A source and a bulk of the FET 10a are coupled to the node N between the bipolar transistors Q1 and Q2. A gate and a drain of the FET 10a are coupled to the signal line 12 and the power supply voltage (Vdd), respectively. A source and a bulk of the FET 10b are coupled to the node N between the bipolar transistors Q3 and Q4. A gate and a drain of the FET 10b are coupled to the signal line 12 and the ground (GND), respectively. In the present embodiment, the bipolar transistors Q1 to Q4 are npn-type transistors, and FETs 10a, 10b are n-channel FETs.

Since the FETs 10a and 10b are coupled to the node N in the electrostatic protective circuit 2, the potential at the node N can follow the change in the signal potential, even if the signal potential changes rapidly. This allows preventing a problem of causing a dielectric breakdown of the protective element, even if the level of the signal potential is less than a breakdown voltage for a protective element.

Figure 7:
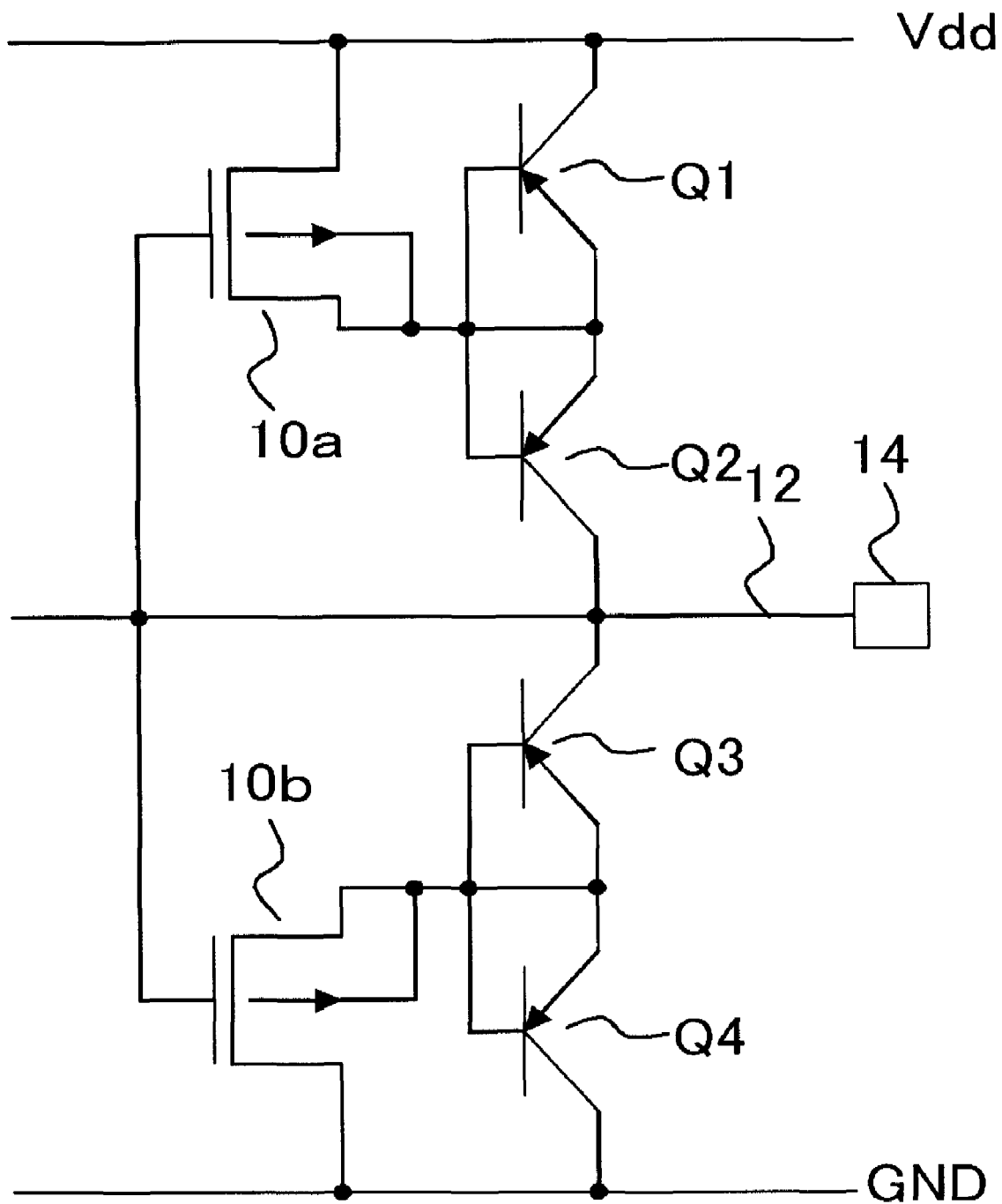
FIG. 7 is a circuit schematic, illustrating a modified version of the electrostatic protective circuit of FIG. 6.

While the npn-type bipolar transistors and the n-channel type FETs have been illustrated in the present embodiment, pnp type bipolar transistors and p-channel type FETs may alternatively be employed. An exemplary implementation thereof is shown in FIG. 7, where a circuit has similar configuration as shown in FIG. 6, except that the bipolar transistors Q1 to Q4 are pnp-type transistors, and the FETs 10a and 10b are the p-channel FETs.

In addition, while the exemplary implementation provided with the protective elements between the signal line and GND and between the signal line and Vdd has been illustrated, it is needless to note that the protective elements may be provided between the signal line and GND or between the signal line and Vdd.

Third Embodiment

Figure 8:
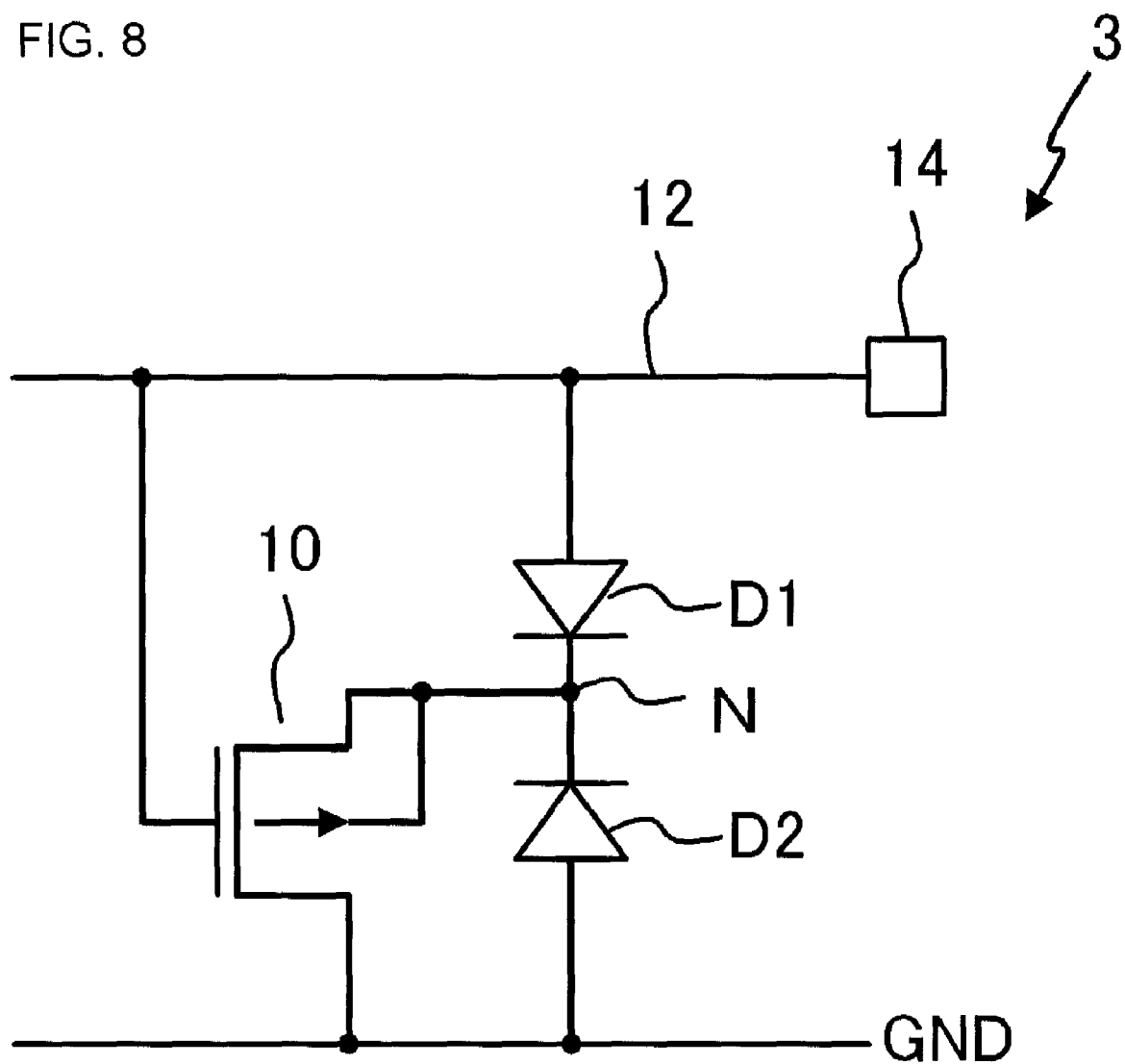
FIG. 8 is a circuit schematic, illustrating third embodiment of an electrostatic protective circuit according to the present invention.

FIG. 8 is a circuit schematic, illustrating third embodiment of an electrostatic protective circuit according to the present invention. An electrostatic protective circuit 3 includes a diode D1, a diode D2 and an FET 10. The diodes D1 and D2 are coupled in series between a signal line 12 and the ground (GND). Cathodes of the diodes D1 and D2 are coupled. In addition, an anode of the diode D1 is coupled to the signal line 12, and an anode of the diode D2 is coupled to GND. A node N between the diodes D1 and D2 are coupled to a source and a bulk of the FET 10. A gate and a drain of the FET 10 are coupled to the signal line 12 and GND, respectively.

Figure 9:
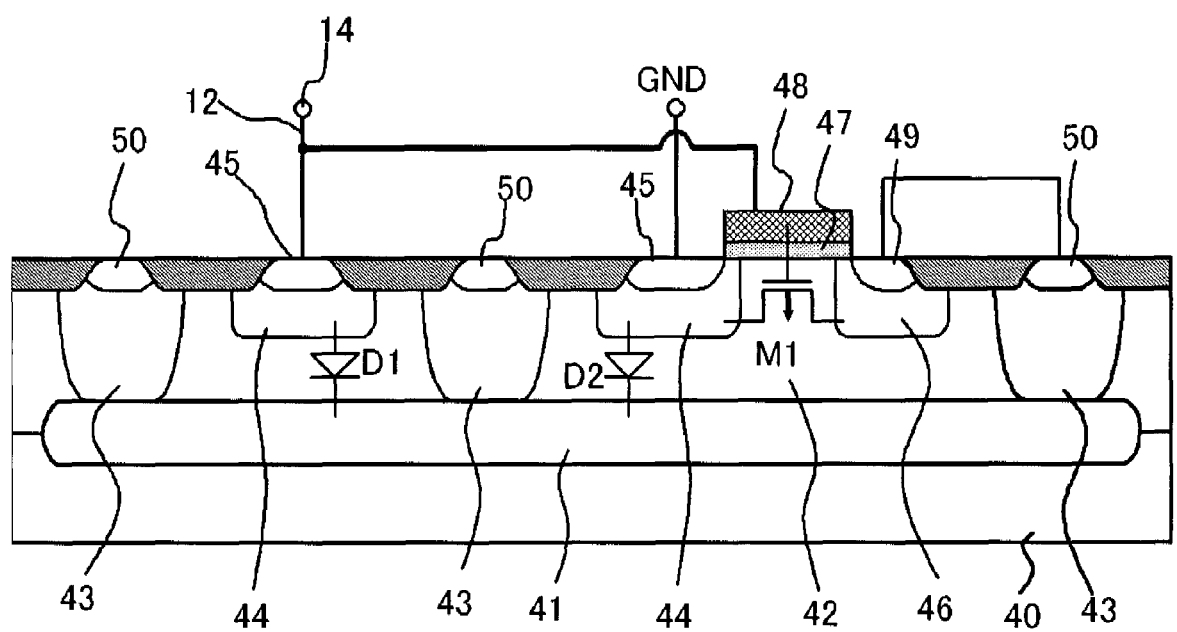
FIG. 9 is a cross-sectional view, illustrating an example of a structure of an electrostatic protective circuit of FIG. 8.

FIG. 9 is a cross-sectional view illustrating one example of structure of electrostatic protective circuit 3. An n-type buried layer 41, which corresponds to the node N, is formed within a p-type substrate 40, and an n-type region 42 is formed on the n-type buried layer 41. In addition, an n-type drawing region 43 is formed so as to surround regions for elements from the surface of the p-type substrate 40 to reach the n-type buried layer 41. In addition, such n-type drawing regions 43 are also formed between each elements. An n-type diffusion layer 50 is formed within the n-type drawing region 43.

A p-type region 44 serving as an anode diffusion layer is formed in a region for forming a diode within the region defined by the n-type drawing region 43, and a p-type diffusion layer 45 is formed therein. A p-type region 46 serving as a source is formed in a common area of the diode D2 and the FET 10 (M1 in FIG. 9) spaced apart from the p-type region 44. A gate oxide film 47 is formed on the substrate between the p-type region 47 and the p-type region 47, and a gate electrode 48 is formed thereon. The film thickness of the gate oxide film 47 is selected to provide a breakdown voltage, which is higher than the breakdown voltages of the diodes D1 and D2. Then, in this embodiment, the p-type region 46 is coupled to the node N (n-type buried layer 41) through the p-type diffusion layer 49, the n-type diffusion layer 50 and the n-type drawing region 43. This achieves the circuit of FIG. 8.

In this embodiment, the impurity-diffusing layer (p-type region 44) functioning as the drain of the FET 10 is provided within the semiconductor substrate (p-type substrate 20), and such impurity-diffusing layer constitutes a portion of the diode D2. This configuration allows reducing the area of the electrostatic protective circuit 3, and eventually reducing the chip area of the semiconductor device that includes the electrostatic protective circuit 3.

Figure 10:
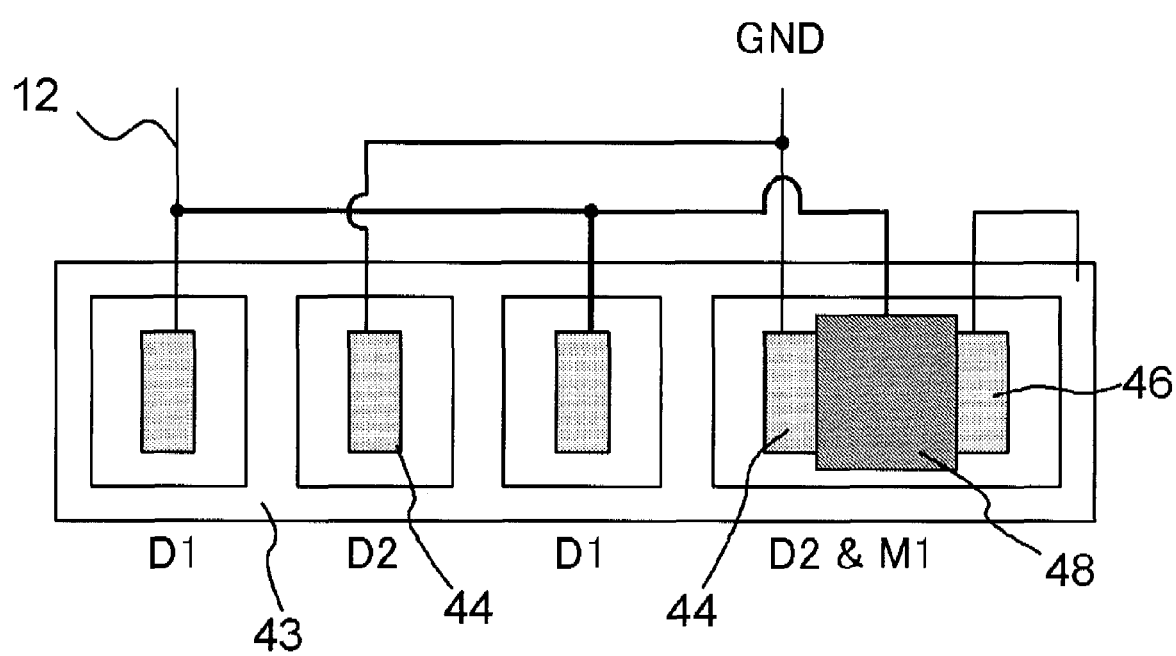
FIG. 10 is a plan view, illustrating an example of a structure of the electrostatic protective circuit of FIG. 8.

While the exemplary implementation that employs the dedicated oxide film for the gate insulating film has been illustrated in FIG. 9, an oxide film for element isolation may also be employed. In addition to above, the exemplary implementation having each one of diodes D1 and D2 is illustrated in reference to FIG. 9, a plurality of diodes D1 and a plurality of diodes D2 may be provided, as shown in FIG. 10. Even in such case, only one FET may be sufficient to be formed.

Figure 15A:
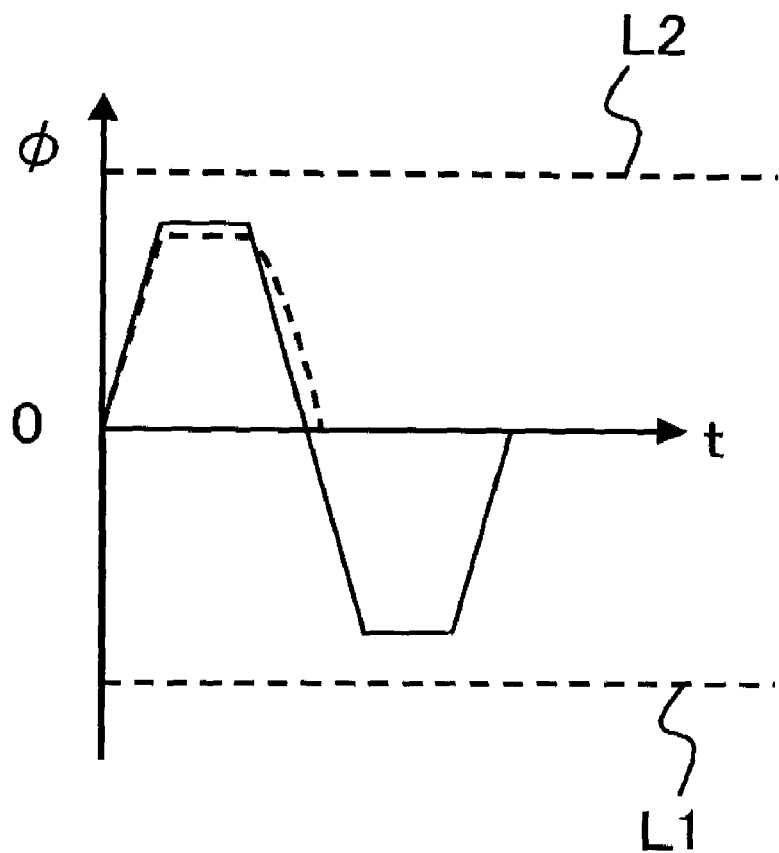
FIGS. 15A and 15B are graphs, useful in describing an exemplary operation of an electrostatic protective circuit of the present embodiment.
Figure 15B:
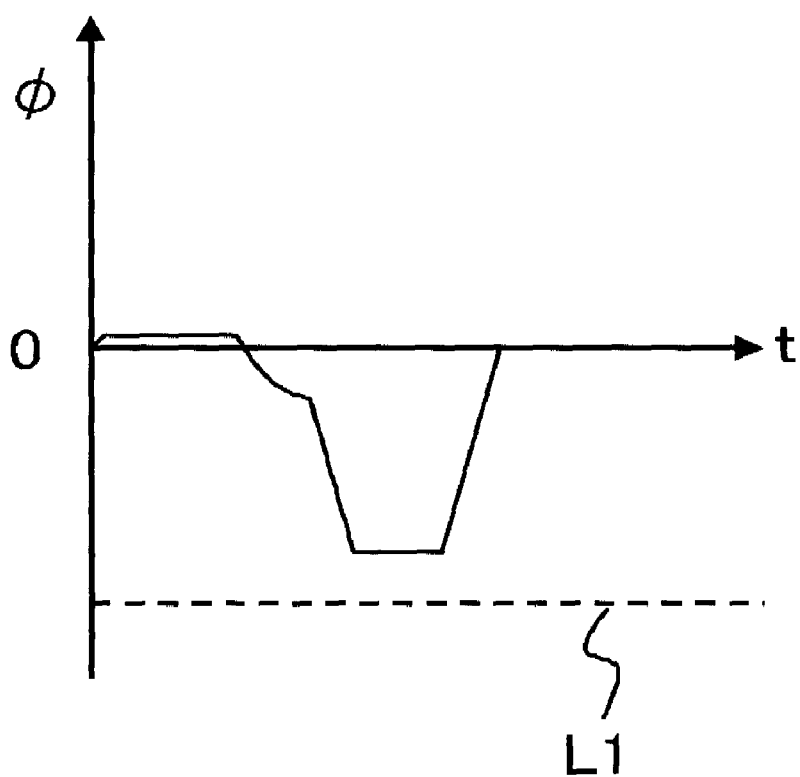

Advantageous effects obtainable by employing the configuration according to the present embodiment will be described. An operation of the protective circuit will be described in the case of the protective circuit 3 being applied with a signal potential, which is swung considerably toward the positive direction at the beginning and then swung considerably toward the negative direction in reference to FIG. 15A and FIG. 15B. Abscissa of these graphs represent time t, and potential φ is shown in ordinate. In addition, a dotted line L1 and a dotted line L2 in the graphs illustrate the breakdown voltages of the diode D1 and diode D2, respectively. In FIG. 15A, waveforms of a signal potential and a potential at a node N are presented by a solid line and a dotted line, respectively. In FIG. 15B, a waveform of a voltage applied to the diode D1 (=signal potential−potential at node N) is presented.

First of all, the diode D1 is forward biased as the signal potential is increased, such that a potential at the node N is also increased as following the increased signal potential.

Then, as the signal potential is dropped, the signal potential is also dropped as compared with the potential at the node N. This provides the gate potential of the FET 10 coupled to the node N, which is lower than the source and the bulk potentials, such that the state of the FET 10 is transferred to the conducting state. Consequently, the potential at the node N is decreased as following the change in the signal potential, and eventually falls in the ground potential. This allows the diode D1 from being applied with an unusual level of voltage.

Since the FET 10 is coupled to the node N in the electrostatic protective circuit 3 as described above, the potential at the node N can follow the change in the signal potential, even if the signal potential changes rapidly. This allows preventing a problem of causing a dielectric breakdown of the protective element, even if the level of the signal potential is less than a breakdown voltage for a protective element.

Figure 19:
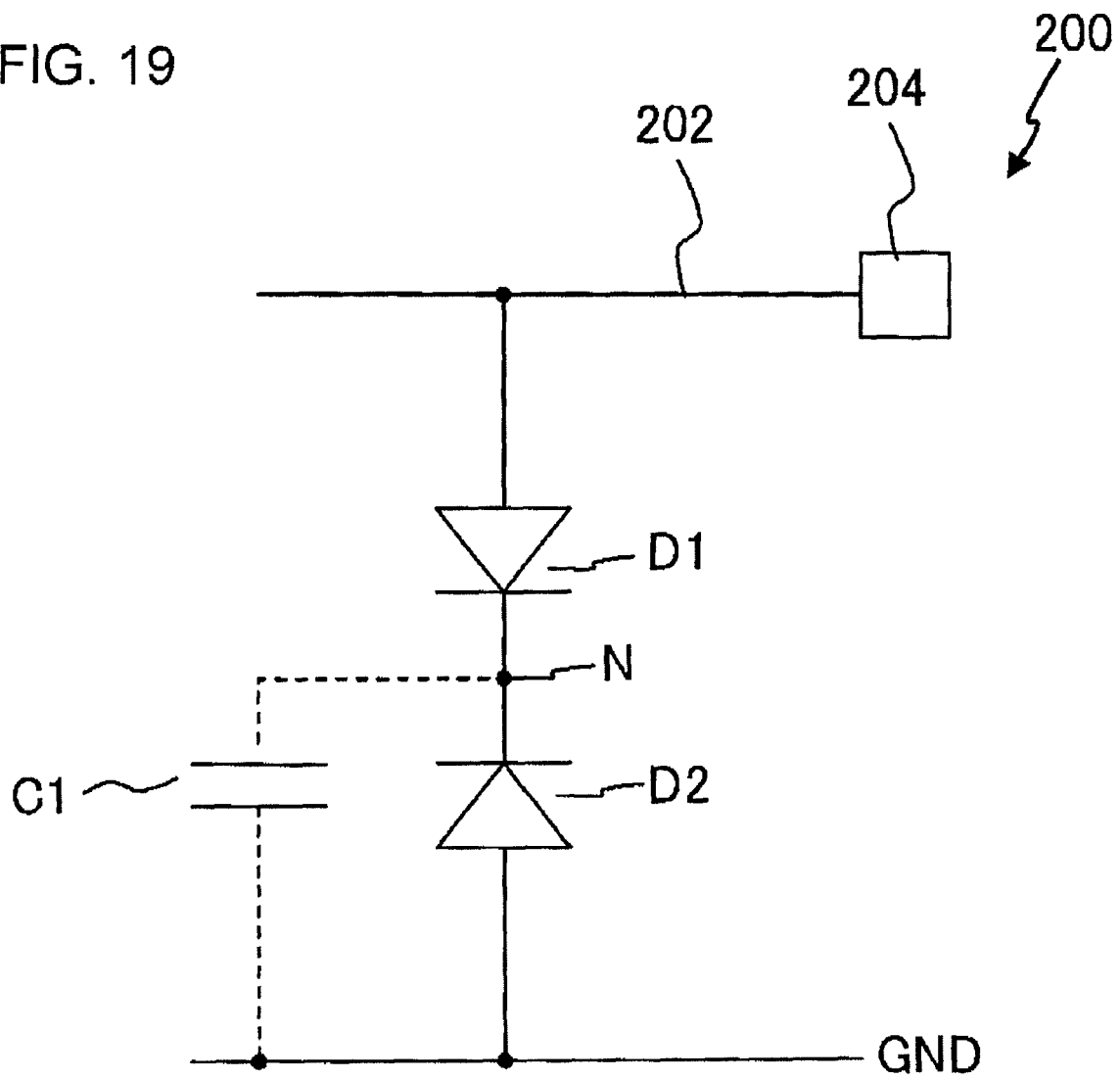
FIG. 19 is a circuit schematic, illustrating a conventional electrostatic protective circuit.

On the contrary, in an electrostatic protective circuit 200 shown in FIG. 19, no FET is coupled to the node N between the diodes D1 and D2. The diodes D1 and D2 are provided between a signal line 202 and the ground (GND), and an external terminal 204 is coupled to one end of the signal line 202.

Figure 20A:
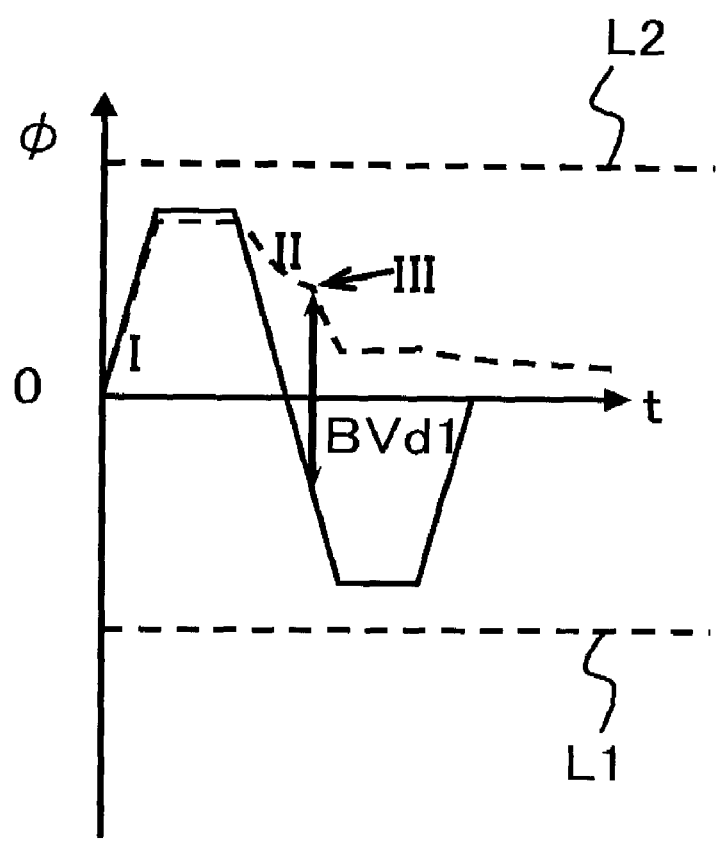
FIGS. 20A and 20B are graphs, useful in describing an exemplary operation of an electrostatic protective circuit of FIG. 19.
Figure 20B:
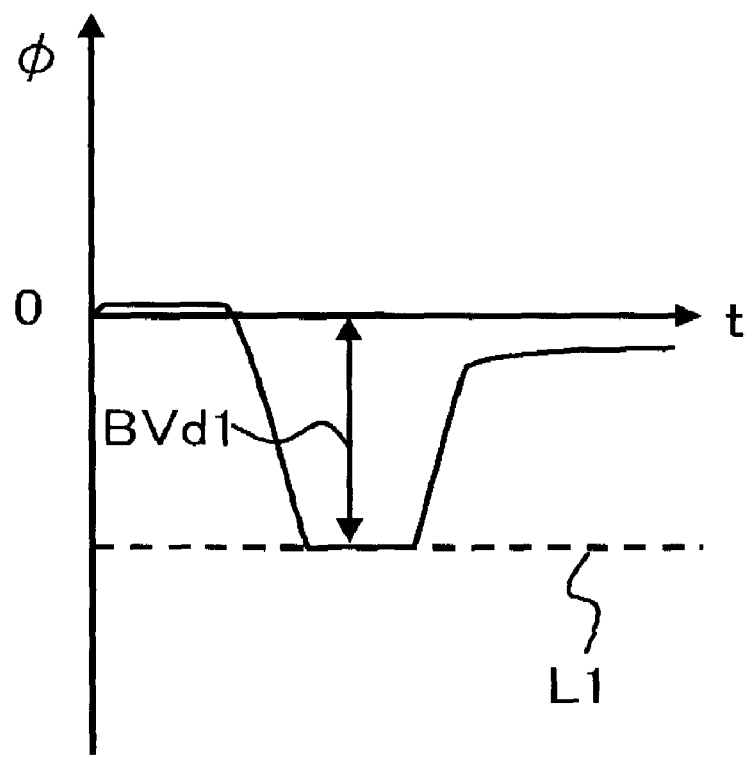

An operation of the protective circuit will be described in the case of the protective circuit 200 being applied with a signal potential, which is swung considerably toward the positive direction at the beginning and then swung considerably toward the negative direction in reference to FIG. 20A and FIG. 20B. Nature of these graphs are similar as described for the graphs of FIG. 15A and FIG. 15B. First of all, when the signal potential is increased (I), the diode D1 is also forward biased, so that the potential at the node N follows the signal potential to be increased.

Next, when the signal potential is to be dropped (II), the potential at the node N is also to be dropped. However, as shown in FIG. 19, a parasitic capacitance C1 is created between the node N and the power supply. Thus, when the signal potential is rapidly changed, the potential at the node N can not follow the change of the signal potential, due to the parasitic capacitance C1. Then, this results in a larger inverse bias voltage applied to the diode D1, and eventually the inverse bias voltage is increased to reach the breakdown voltage (BVd1) for the diode D1 (III). Even if the level of the signal potential is lower than the breakdown voltage for the diode D1, a dielectric breakdown of the D1 may be possibly occurred. Then, the diode D1 is in the conducting state, such that the potential at the node N is changed by following the signal level by an offset voltage, which is equivalent to the breakdown voltage for the diode D1.

Figure 21A:
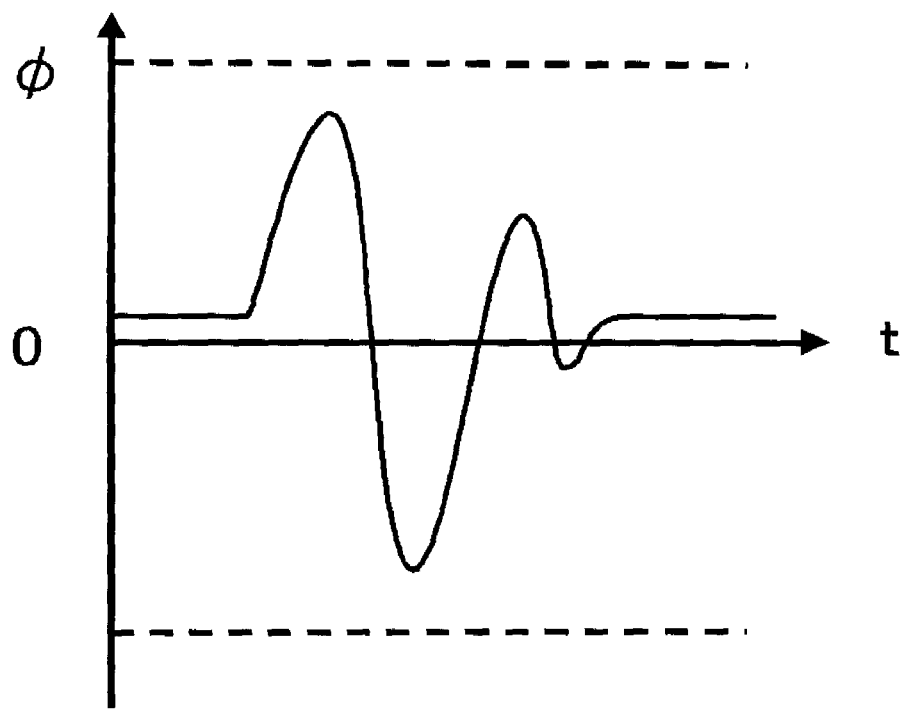
FIGS. 21A and 21B are graphs, useful in describing an exemplary operation of an electrostatic protective circuit of FIG. 19.
Figure 21B:
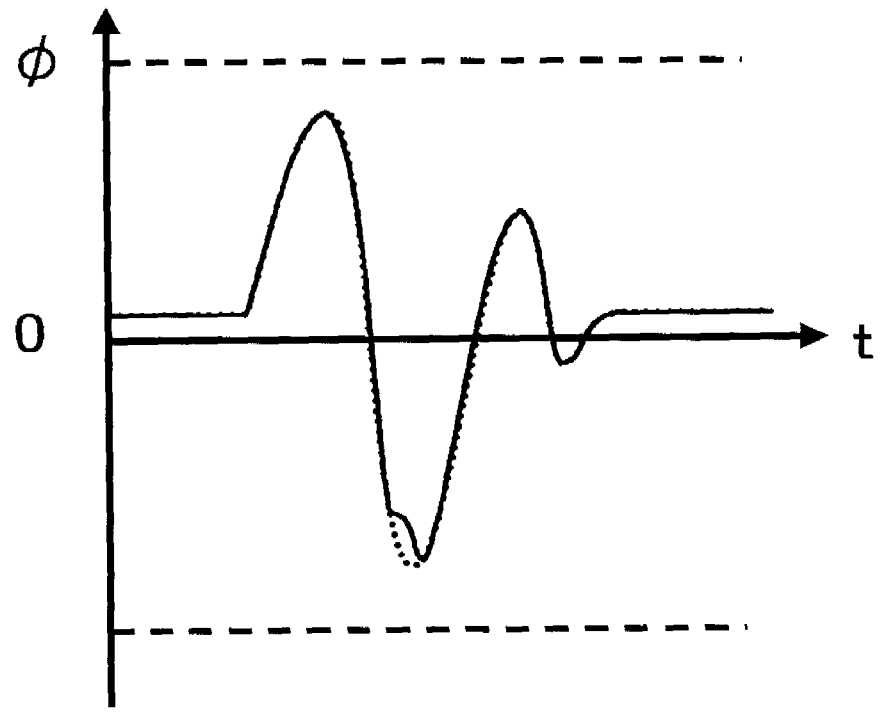

As a result, a problem of greatly deformed real waveform of the potential at the external terminal 204 as shown in FIG. 21B may be caused, when a signal having a waveform as shown in FIG. 21A is entered to the external terminal 204 of the electrostatic protective circuit 200. In addition, the electric charge once accumulated in the parasitic capacitance C1 at the node N can not be easily eliminated due to an inverse bias generated in the diode, so that a higher potential at the node N is to be maintained for longer duration time. Consequently, a similar phenomenon may be occurred even if a negative signal is entered when a certain time is passed after a positive signal is first entered. As described above, a problem of causing an abnormal waveform may be occurred even if the signal potential is still lower than the breakdown voltage for the diode. According to the present embodiment, such problem can be avoided.

Figure 11:
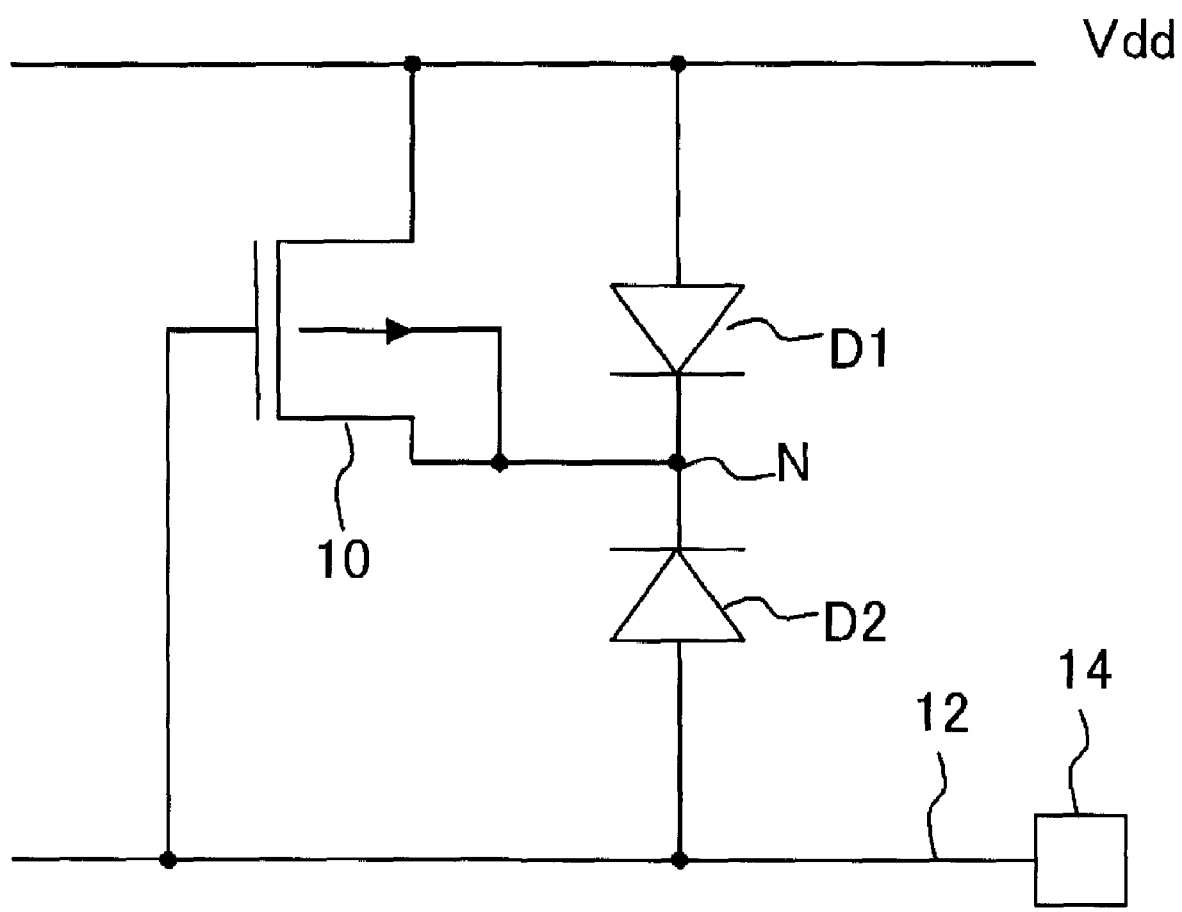
FIG. 11 is a circuit schematic, illustrating a modified version of the electrostatic protective circuit of FIG. 8.

In addition to above, the exemplary implementation that provides the protective elements between the signal line and the ground (GND) is illustrated in the present embodiment, the protective elements may alternatively be provided between the signal line and the positive power supply voltage (Vdd), as shown in FIG. 11. In addition, protective elements may be provided between the signal line and the ground (GND) and between the signal line and the power supply voltage (Vdd).

Fourth Embodiment

Figure 12:
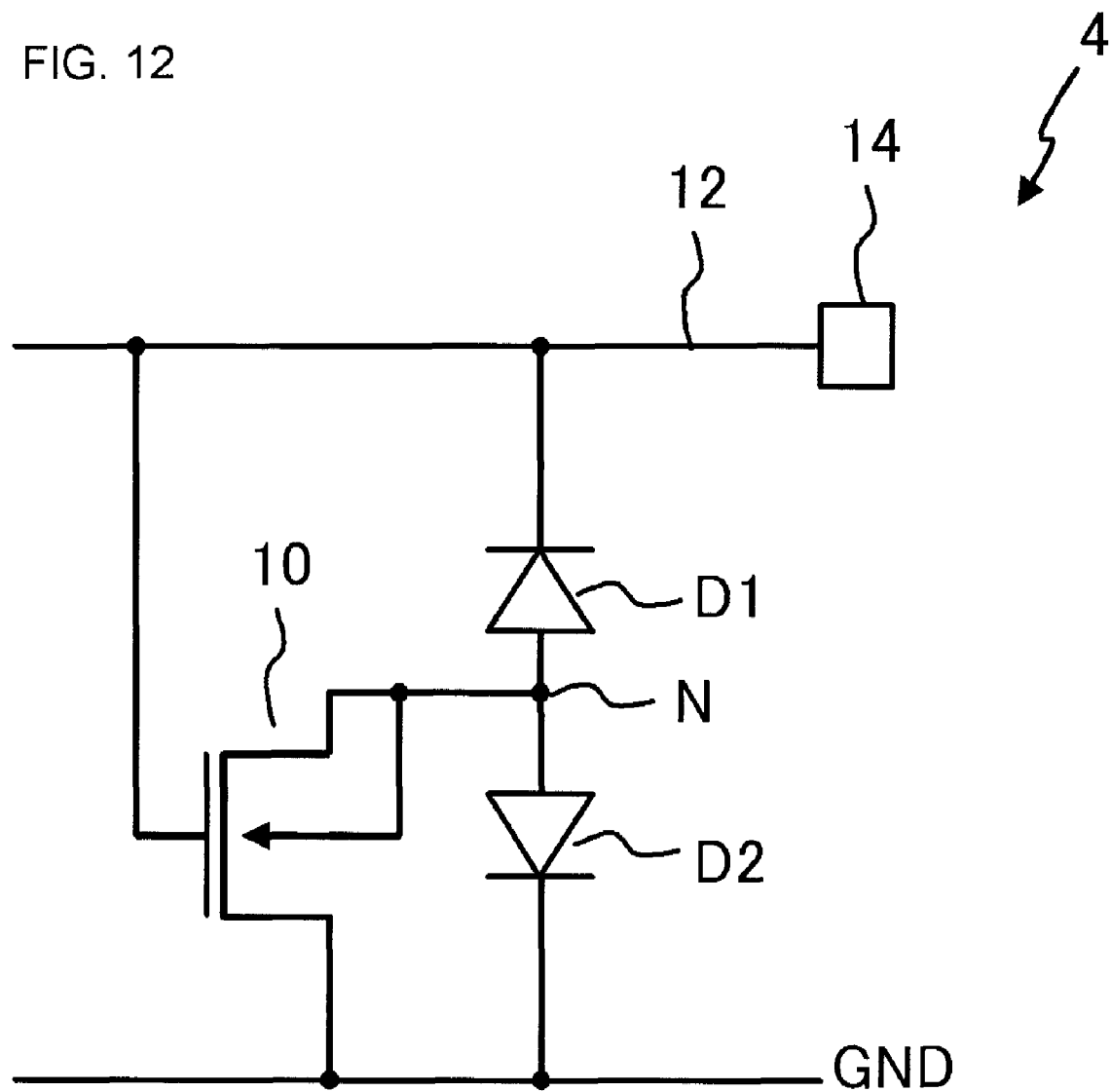
FIG. 12 is a circuit schematic, illustrating fourth embodiment of an electrostatic protective circuit according to the present invention.

FIG. 12 is a circuit schematic, illustrating fourth embodiment of an electrostatic protective circuit according to the present invention. An electrostatic protective circuit 4 includes a diode D1, a diode D2 and an FET 10. The diodes D1 and D2 are coupled in series between a signal line 12 and the ground (GND). Anodes of the diodes D1 and D2 are coupled. In addition, a cathode of the diode D1 is coupled to the signal line 12, and a cathode of the diode D2 is coupled to GND. A node N between the diodes D1 and D2 are coupled to a source and a bulk of the FET 10. A gate and a drain of the FET 10 are coupled to the signal line 12 and GND, respectively.

Since the FETs 10a and 10b are coupled to the node N in the electrostatic protective circuit 4, the potential at the node N can follow the change in the signal potential, even if the signal potential changes rapidly. This allows preventing a problem of causing a dielectric breakdown of the protective element, even if the level of the signal potential is less than a breakdown voltage for a protective element.

Figure 13:
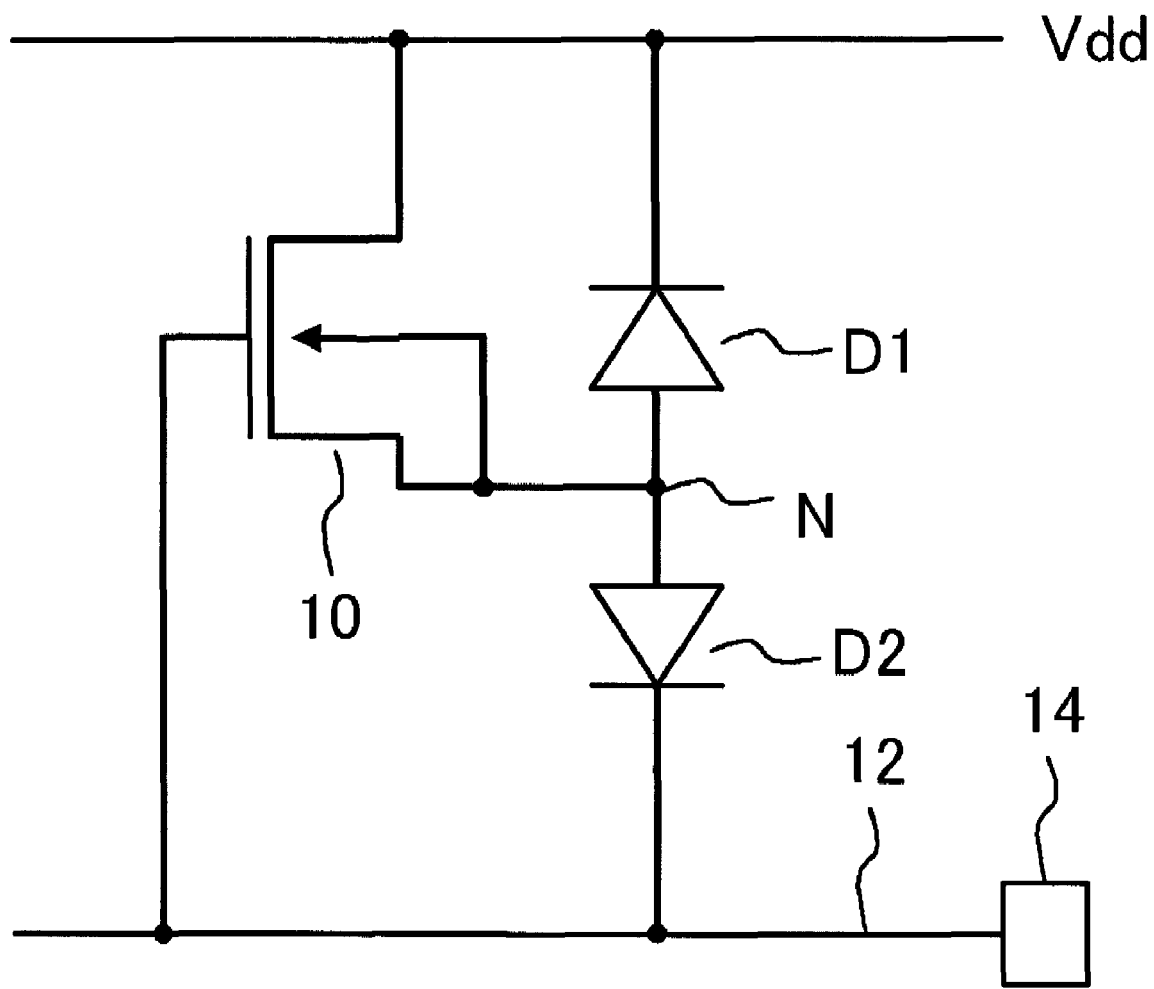
FIG. 13 is a circuit schematic, illustrating a modified version of an electrostatic protective circuit of FIG. 12.

While the exemplary implementation that provides the protective elements between the signal line and the ground (GND) is illustrated in the present embodiment, the protective elements may alternatively be provided between the signal line and the positive power supply voltage (Vdd), as shown in FIG. 13. In addition, protective elements may be provided between the signal line and the ground (GND) and between the signal line and the power supply voltage (Vdd).

Fifth Embodiment

Figure 14:
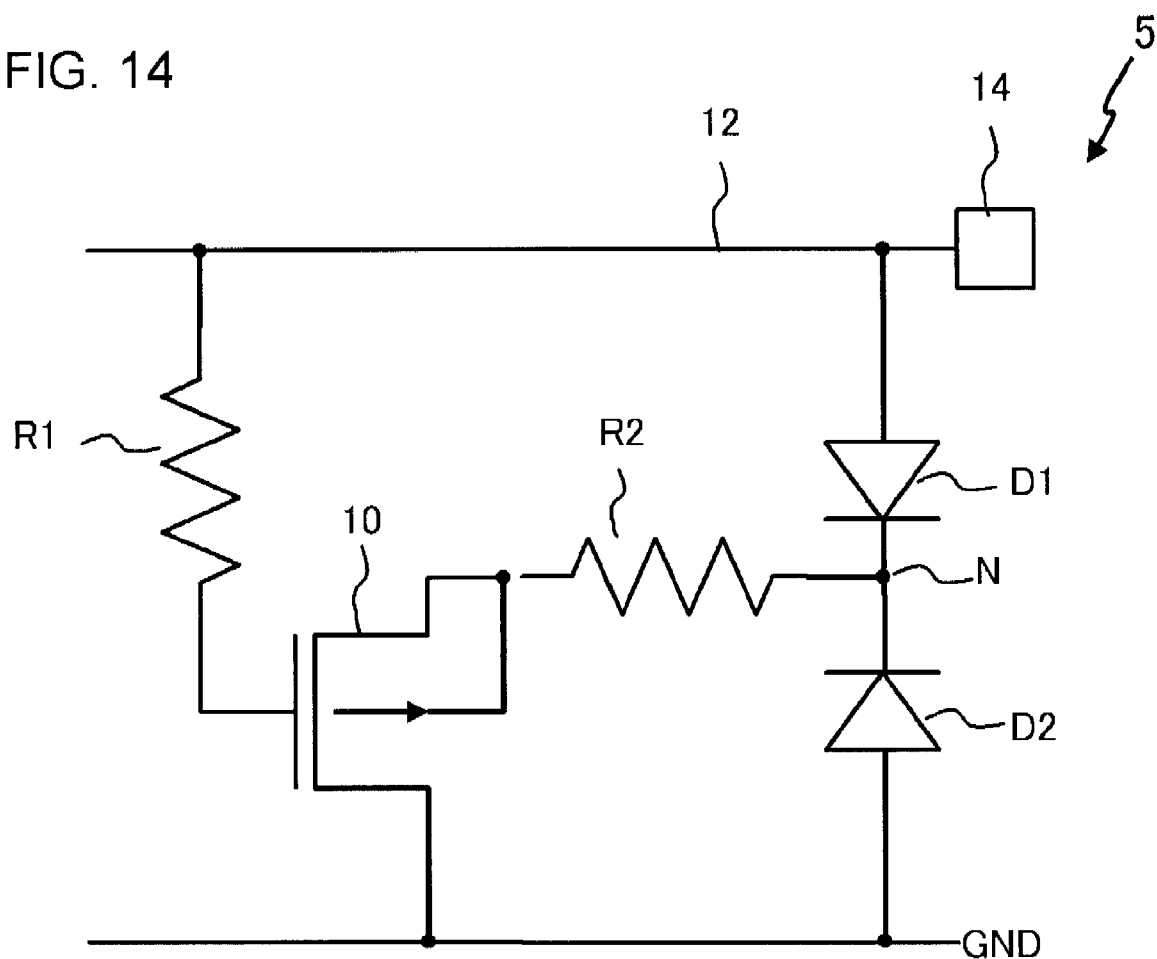
FIG. 14 is a circuit schematic, illustrating fifth embodiment of an electrostatic protective circuit according to the present invention.

FIG. 14 is a circuit schematic, illustrating fifth embodiment of an electrostatic protective circuit according to the present invention. In an electrostatic protective circuit 5, a gate of the FET 10 is coupled to a signal line 12 through a resistive element R1, and a source and a bulk of the FET 10 are coupled to the ground (GND) through the resistive element R2. Other circuit architectures thereof is similar to that of the electrostatic protective circuit 3 of FIG. 8.

In the electrostatic protective circuit 5, the presence of the resistive element R1 and the resistive element R2 allows reducing a rapid voltage variation in each of the gate and the source. Other advantageous effects of the present embodiment are similar to that of each of the above-described embodiments.

While the exemplary implementation, in which the circuit is provided with the resistive elements for both of the gate and the source, has been illustrated in the present embodiment, the resistive elements may alternatively be provided only in either one thereof. In addition, while the exemplary implementation, in which the circuit is provided with the resistive elements R1 and R2 has been illustrated, each of the circuits shown in FIGS. 1, 4, 5, 6, 7, 11, 12 and 13 may also include the resistive element R1 and R2.

It is apparent that the electrostatic protective circuits and the semiconductor device of the present invention are not limited to the above embodiment, and may be modified and changed without departing from the scope and spirit of the invention. For example, in each of the above-described embodiments, the FET employed in the internal circuit of the semiconductor device provided with the electrostatic protective circuit mounted therein may also be employed for the FET that is to be coupled to the node. Such FET is an element to be protected, and therefore the breakdown voltage thereof is higher than that of the protective element. Therefore, even if the operation of the protective element is in sudden surge, no abnormal voltage beyond the breakdown voltage is applied to the FET. Thus, transistors of smaller dimension can be employed.

It is apparent that the present invention is not limited to the above embodiment, and may be modified and changed without departing from the scope and spirit of the invention.

What is claimed is:

1. An electrostatic protective circuit, comprising:
a first and a second protective elements, which are coupled in series between a signal line and a power supply; and
a field effect transistor, having a source, a bulk, a gate and a drain, wherein said source and said bulk are coupled between said first and said second protective elements, said gate is coupled to said signal line, and said drain is coupled to said power supply.

2. The electrostatic protective circuit as set forth in claim 1, wherein each of said protective elements is a bipolar transistor.

3. The electrostatic protective circuit as set forth in claim 2, wherein a collector of said first protective element is coupled to a collector of said second protective element, an emitter and a base of said first protective element are coupled to said signal line, and an emitter and a base of said second protective element are coupled to said power supply.

4. The electrostatic protective circuit as set forth in claim 3, wherein said bipolar transistor is an npn-type, and said field effect transistor is a p-channel type.

5. The electrostatic protective circuit as set forth in claim 3, wherein said bipolar transistor is a PNP-type, and said field effect transistor is an n-channel type.

6. The electrostatic protective circuit as set forth in claim 2, wherein an emitter and a base of said second protective element are coupled to an emitter and a base of said first protective element, respectively, wherein a collector of said first protective element is coupled to said signal line, and wherein a collector of said second protective element is coupled to said power supply.

7. The electrostatic protective circuit as set forth in claim 6, wherein said bipolar transistor is an npn-type, and said field effect transistor is an n-channel type.

8. The electrostatic protective circuit as set forth in claim 6, wherein said bipolar transistor is a pnp-type, and said field effect transistor is a p-channel.

9. The electrostatic protective circuit as set forth in claim 1, wherein each of said protective elements is a diode.

10. The electrostatic protective circuit as set forth in claim 9, wherein a cathode of said first protective element is coupled to a cathode of said second protective element, and anodes of said first and said second protective elements are coupled to said signal line and said power supply, respectively.

11. The electrostatic protective circuit as set forth in claim 9, wherein an anode of said first protective element is coupled to an anode of said second protective element, and cathodes of said first and said second protective elements are coupled to said signal line and said power supply, respectively.

12. The electrostatic protective circuit as set forth in claims 1, wherein said gate of said field effect transistor is coupled to said signal line through a resistive element.

13. The electrostatic protective circuit as set forth in claims 1, wherein said source and said bulk of said field effect transistor are coupled to said power supply through a resistive element.

14. The electrostatic protective circuit as set forth in claims 1, further comprising an impurity-diffusing layer, which is provided in the semiconductor substrate and serves as said drain of said field effect transistor, wherein said impurity-diffusing layer constitutes portions of said the first or said second protective elements.

15. A semiconductor device, comprising an electrostatic protective circuit as set forth in claims 1.

16. The semiconductor device as set forth in claim 15, wherein said field effect transistor is a field effect transistor employed in the internal circuit of the semiconductor device.

17. An electrostatic protective circuit, comprising:
a first and a second protective element which are coupled in series with opposite polarity between a signal line and a power supply; and
a field effect transistor, having a source, a bulk, a gate and a drain, wherein said source and said bulk are coupled between said first and said second protective elements, said gate is coupled to said signal line, and said drain is coupled to said power supply.

* * * * *